United States Patent
Mitsumoto et al.

(10) Patent No.: US 9,298,052 B2
(45) Date of Patent: Mar. 29, 2016

(54) DISPLAY APPARATUS

(71) Applicant: Sharp Kabushiki Kaisha, Osaka (JP)

(72) Inventors: Kazuyori Mitsumoto, Osaka (JP); Masahiro Yoshida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/420,043

(22) PCT Filed: Aug. 2, 2013

(86) PCT No.: PCT/JP2013/070964
§ 371 (c)(1),
(2) Date: Feb. 6, 2015

(87) PCT Pub. No.: WO2014/024783
PCT Pub. Date: Feb. 13, 2014

(65) Prior Publication Data
US 2015/0219944 A1    Aug. 6, 2015

(30) Foreign Application Priority Data

Aug. 9, 2012 (JP) ................................. 2012-177268

(51) Int. Cl.
| | | |
|---|---|---|
| *G02F 1/1345* | (2006.01) |
| *G02F 1/1339* | (2006.01) |
| *H01L 51/52* | (2006.01) |
| *H01L 27/32* | (2006.01) |
| *G02F 1/1333* | (2006.01) |
| *G02F 1/1362* | (2006.01) |

(52) U.S. Cl.
CPC ............ *G02F 1/1345* (2013.01); *G02F 1/1339* (2013.01); *G02F 1/133345* (2013.01); *H01L 27/3276* (2013.01); *H01L 51/5246* (2013.01); *G02F 1/136286* (2013.01)

(58) Field of Classification Search
CPC ................ G02F 1/1345; G02F 1/1339; G02F 1/133345; H01L 27/3276; H01L 51/5246
See application file for complete search history.

(56) References Cited

U.S. PATENT DOCUMENTS

| | | |
|---|---|---|
| 6,473,147 B1 | 10/2002 | Nakahara et al. |
| 2007/0030409 A1 | 2/2007 | Aoki |
| 2008/0143945 A1 | 6/2008 | Jeong et al. |
| 2013/0033667 A1 | 2/2013 | Yanagisawa et al. |

FOREIGN PATENT DOCUMENTS

| | | |
|---|---|---|
| JP | 2007-47259 A | 2/2007 |
| JP | 2008-152261 A | 7/2008 |
| JP | 2013-037049 A | 2/2013 |
| WO | 99/52011 A1 | 10/1999 |

*Primary Examiner* — James Dudek
(74) *Attorney, Agent, or Firm* — Chen Yoshimura LLP

(57) ABSTRACT

The present invention provides a display device, whereby occurrence of defects due to a sealing member being uncured, and occurrence of defective products due to misalignment can be suppressed, and furthermore, in the cases where misalignment is generated, variance of a curing time of the seal material and power consumption among display apparatuses can be reduced. This display device is provided with a first substrate, a second substrate, and a seal between the first substrate and the second substrate. The first substrate includes a plurality of conductive layers, a plurality of bus lines, and first and second lead-out lines that are connected to the corresponding bus lines, respectively. The first and second lead-out lines respectively include, below the seal, a first portion and a second portion. The first and second portions are respectively provided in different conductive layers, and extend in a first direction. One of the first and second portions partially overlaps the other, and the position of the second portion with respect to the first portion changes in a prescribed period.

6 Claims, 17 Drawing Sheets

DISPLAY APPARATUS

TECHNICAL FIELD

The present invention relates to a display device. More specifically, the present invention relates to a display device having a seal between two substrates facing each other.

BACKGROUND ART

An active matrix display device (active matrix liquid crystal display device, for example) usually includes a display unit having a plurality of pixels arrayed thereon, a frame portion disposed in a periphery of the display unit, and an active matrix substrate (hereinafter, also referred to as array substrate). In general, an array substrate has wiring lines such as bus lines and switching elements such as thin-film transistors (TFTs) in an area corresponding to the display unit (hereinafter, also referred to as display region), and the array substrate has lead-out lines connected to the bus lines in an area corresponding to the frame portion (hereinafter, also referred to as frame region). Recently, narrower frames are in demand from the perspective of improving design and reducing the size of the device. Below is an example of a technology related to the frame portion.

Patent Document 1, for example, discloses a display device that has a display region on which a gate line and a data line are formed so as to intersect each other with a gate insulating film therebetween, a display substrate including first, second, third, and fourth peripheral regions surrounding the four sides of the display region, an opposite substrate facing the display substrate and sandwiching liquid crystal therebetween, a seal line that is formed in an edge between the display substrate and the opposite substrate and that binds the display substrate to the opposite substrate, and a driver chip mounted on the first peripheral region of the display substrate adjacent to the first edge portion of the gate line. The display substrate has first and second data signal applying lines disposed alternately sandwiching the gate insulating film and connecting the data line and the driver chip, and the first data signal applying line is formed such that a portion thereof overlaps the second data signal applying line such that the seal line is exposed.

Patent Document 2, for example, discloses a liquid crystal display device that has liquid crystal sealed in an area surrounded by a wiring substrate, an opposite substrate, and a sealing member. In addition, the liquid crystal display device has, on the wiring substrate thereof, a plurality of scan signal lines formed on the display region disposed inside the sealing member, a plurality of display signal lines that intersect the scan signal lines through a gate insulating film, and a common signal line disposed outside of the display region. The common signal line has at least two layers of conductive layers, and the pattern width of at least one of the conductive layers changes under the pattern of the sealing member.

In addition, Patent Document 3, for example, discloses a liquid crystal display device that is formed by bonding a first substrate having a first electrode and an external connection terminal to a first substrate having a second electrode by a looped sealing member.

RELATED ART DOCUMENTS

Patent Documents

Patent Document 1: Japanese Patent Application Laid-Open Publication No. 2008-152261

Patent Document 2: Japanese Patent Application Laid-Open Publication No. 2007-47259

Patent Document 3: WO 99/52011

SUMMARY OF THE INVENTION

Problems to be Solved by the Invention

A display device related to Comparison Example 1 studied by the inventors of the present invention will be discussed with reference to FIGS. 19 and 20.

As shown in FIG. 19, an array substrate included in the display device related to Comparison Example 1 has lead-out lines 1018a and 1018b. The lead-out lines 1018a and 1018b are disposed alternately within the frame region and are covered by a seal (not shown). The material of the seal (hereinafter, also referred to as sealing member) is photocurable (ultraviolet curable, for example), and the seal includes the cured material of the sealing member. The lead-out line 1018a is provided in the same conductive layer as the gate bus line, and the lead-out line 1018b is provided in the same conductive layer as the source bus line.

Hereinafter, the conductive layer having the gate bus line is also referred to as the gate layer and the conductive layer having the source bus line is also referred to as the source layer.

Comparison Example 1 makes it possible for the frame portion to be made narrower than if all of the lead-out lines are provided in the same conductive layer, because a plurality of lead-out lines can be disposed within a narrower region. However, in Comparison Example 1, if adjacent lead-out lines are not overlapping, then the sealing member cannot be sufficiently cured, thereby resulting in a decrease in panel strength and causing defects such as display anomalies. This is because a sufficient light transmissive region cannot be secured due to lead-out lines blocking a large portion of light (ultraviolet light, for example) radiated from the array substrate side to the sealing member. The reason for radiating light from the array substrate side is because, usually, a light-shielding member such as a BM is formed on the opposite substrate that faces the array substrate.

In addition, as shown in FIG. 20, in Comparison Example 1, if adjacent lead-out lines completely overlap, then the light transmissive region can be secured, but the time in which the sealing member cures and the power consumption varies greatly among individual products. This is because, if the gate layer and/or the source layer are not aligned as planned in the photolithography process during manufacturing of the array substrate, the size of the area of the lead-out lines 1018a and 1018b overlapping, and the size of the area of the gap between the lead-out lines varies easily among individual products. In the case shown in FIG. 20, the adjacent lead-out lines overlap completely, and thus, the parasitic capacitance increases, which causes greater power consumption.

Next, a display device related to Comparison Examples 2 and 3 will be described with reference to FIGS. 21 and 22.

As shown in FIG. 21, the array substrate included in the display device related to Comparison Example 2 has lead-out lines 1118a and 1118b, and the array substrate included in the display device related to the Comparison Example 3 has lead-out lines 1218a and 1218b, as shown in FIG. 22. Other than the plan view pattern of the lead-out lines being different, Comparison Examples 2 and 3 are substantially the same as Comparison Example 1. The lead-out line 1118b partially overlaps the lead-out line 1118a. The lead-out line 1218a is bent in a zigzag pattern, and the lead-out line 1218b partially overlaps the lead-out line 1218a. The lead-out line 1218b has a portion that is disposed on a side of the lead-out line 1218*a*, but does not have a portion on the other side of the lead-out line 1218*a*. According to Comparison Examples 2 and 3, because the adjacent lead-out lines are only partially overlapping one another, the parasitic capacitance can be reduced compared to the case shown in FIG. 20. In addition, the light transmissive region can be secured as well. However, in a similar manner to the case shown in FIG. 20, if shifts in alignment take place, the curing time of the sealing material and the power consumption will vary greatly among the individual products. Furthermore, if shifts in alignment take place, there is a possibility that a product with greater parasitic capacitance than a standard product manufactured in accordance with the blueprint will be manufactured, and a defective product may be formed.

The present invention takes into consideration the above-mentioned situation, and an object thereof is to provide a display device that can suppress defects from taking place due to sealing members not curing, and that can suppress defective products from being manufactured due to shifts in alignment, and in addition, can reduce variation among individual products in the time for curing sealing members and power consumption.

Means for Solving the Problems

The inventors of the present invention took into consideration the above-mentioned situation and performed various research on a display device that can suppress defects caused by sealing members not curing and defective products from occurring due to shifts in alignment, and in addition, that can reduce the variation in the curing time of sealing members and the power consumption among individual products. In the end, the inventors focused on the plan view patterns of the lead-out lines under the seal. The inventors found that a sufficient light transmissive region can be secured under the seal by two lead-out lines (first and second lead-out lines) both having a first portion and a second portion, the first and second portions being respectively provided in different conductive layers such that the first and second portions extend in the first direction in a plan view and that one of the first and second portions partially overlaps the other. Furthermore, it has been found that the manufacturing of products having large parasitic capacitance compared to standard products manufactured according to the blueprint can be prevented, and even if shifts in alignment occur, the variation in the size of the area of the light transmissive region and the size of the parasitic capacitance can be made smaller. This can be achieved by providing the first portion and the second portion as follows. The first portion is provided so as to have at least a third portion located on one side of the second portion, and at least a fourth portion located on another side of the second portion such that at least the third portion and at least the fourth portion are disposed alternately in the first direction. The second portion is provided so as to have at least a fifth portion that is located on one side of the first portion, and at least a sixth portion located on another side of the first portion such that at least the fifth portion and at least the sixth portion are disposed alternately in the first direction. As a result, the present invention was conceived when it was found that the issue above can be solved.

In other words, a feature of the present invention includes a display device (hereinafter, also referred to as display device related to the present invention) having a plurality of pixels, including:

a first substrate;

a second substrate facing the first substrate; and a seal provided between the first substrate and the second substrate, wherein the first substrate has an insulating substrate, a plurality of bus lines provided in an area (display area), and a plurality of lead-out lines provided outside the display area to connect to the plurality of bus lines, respectively, wherein the plurality of lead-out lines include a first lead-out line and a second lead-out line, wherein the first lead-out line and the second lead-out line include, under the seal, a first portion and a second portion, respectively, wherein the first portion and the second portion are provided in a different layer from one another, and extend in a first direction in a plan view, wherein the first portion and the second portion partially overlaps with each other, wherein the first portion has one or more third portions located on one side of the second portion, and has one or more fourth portions located on another side of the second portion in the plan view, wherein the one or more third portions and the one or more fourth portions are disposed alternately in the first direction, wherein the second portion includes one or more fifth portions located on one side of the first portion, and one or more sixth portions located on another side of the first portion in the plan view, and wherein the one or more fifth portions and the one or more sixth portions are disposed alternately in the first direction.

As long as the display device related to the present invention includes these types of constituting elements, other constituting elements are not limited in particular, but the first substrate may have at least one insulating film provided on the insulating substrate, and the plurality of conductive layers may be stacked alternately with at least one insulating film mentioned above. The respective functions of the aforementioned at least one insulating film are not limited in particular, but each of the aforementioned at least one insulating film usually functions as a gate insulating film or an interlayer insulating film.

In the present specification, in order to be clear, the boundaries of the bus lines and the lead-out lines are set to be on the outline of the display region, in which the bus lines are disposed within the display region and the lead-out lines are disposed within the frame region.

Descriptions of preferable embodiments of the display device related to the present invention will be provided below. The preferable embodiments below may be combined as appropriate, and an embodiment in which two or more of the preferable embodiments below are combined is also a preferable embodiment.

The first portion and the second portion may respectively take a shape of a meandering path in the plan view.

From a perspective of reducing the parasitic capacitance, it is preferable that the first substrate have at least two insulating films interposed between the first portion and the second portion.

From the same perspective, it is preferable that the first substrate has at least two insulating films interposed between the conductive layer having the first portion and the conductive layer having the second portion.

At least one of the first portion and the second portion may have a wave shape in the plan view. As a result, the first and/or second portion can be formed in a suitable pattern for the die-to-die comparison test.

The type of the wave shape is not limited in particular, and can be in a sine wave shape, a saw wave shape, a rectangle wave shape, a triangle wave shape, a trapezoid wave shape, or the like. However, among these forms, the triangle wave shape and the trapezoid wave shape are suitable. In other words, it is preferable that one or more of the first and second portions are formed in a trapezoid wave shape or a triangle wave shape in a plan view. The trapezoid wave shape is preferable from the perspective of efficiently securing the light transmissive region, and the triangle wave shape is preferable from the perspective of effectively suppressing defects caused by shifts in alignment. On the other hand, if the wave was in a saw shape, then a portion bent in an acute angle will be formed, and if the wave is in a rectangle shape, then a portion bent in a right angle will be formed. As a result, if a plurality of the first and/or the second portions are provided in a saw wave shape or a rectangle wave shape, then there is a risk that the gap between the bent portion and the first or second portion adjacent to the first or second portion having the bent portion can become narrow. Therefore, from the perspective of preventing the gap between the first or second portions adjacent to each other becoming narrow, it is preferable that one or more of the first and the second portions be formed in a sine wave shape, a trapezoid wave shape, or a triangle wave shape in a plan view.

It is preferable that the plurality of lead-out lines include a plurality of the first lead-out lines, wherein the plurality of the first lead-out lines include a plurality of the first portions, the respective first portions being arranged in a second direction perpendicular to the first direction, wherein each of the plurality of the first portions is formed in a trapezoid wave shape in the plan view and include flat portions parallel to the first direction and slanted portions that extend diagonally with respect to the first direction, wherein respective edges of the flat portions included in each of the plurality of first portions are located on the same first virtual line, wherein the respective other edges of the flat portions are located on the same second virtual line, wherein the first virtual line is substantially parallel to the second virtual line, and wherein the angles respectively formed between the first direction and the plurality of slanted portions of the plurality of first portions are 15° or less.

As a result, multiple lead-out lines can be efficiently disposed in a narrow area. Furthermore, the width of each first portion and each gap between adjacent first portions can be effectively suppressed from changing depending on the location.

In the present embodiment, being substantially parallel means that the angle between the first virtual line and the second virtual line is 0.1° or less, and it is preferable that the angle be 0.03° or less. Furthermore, the plurality of first portions may each be disposed in a bent state in a plan view.

The reason behind setting the upper limit of the aforementioned angle as 15° is as follows.

The aforementioned angle needs to be set as 11.x° (≈12° or less in order to prevent the width of the slanted portion becoming smaller than the width of the flat portion by 0.1 μm or more, and in order to prevent the gap between the slanted portions of the first portions adjacent to each other from becoming smaller than the gap between the respective flat portions by 0.1 μm or more. This 0.1 μm value is the smallest unit on figures generally used for designing masks during the manufacturing process, and thus, this means that the design dimensions do not differ substantially as long as there is no difference that is 0.1 μm or more. Therefore, the width of the slanted portion can be made substantially the same as the width of the flat portion, and in order to make the gap between the slanted portions and the gap between the flat portions substantially the same, it is preferable that the angle be 12° or less. The upper limit was set as 15° based on this 12° angle after taking into account practical applicability.

If the angle is set at 15°, and if the difference in width between the slanted portion and the flat portion is 0.1 μm or less, then a difference of approximately 0.1 μm to 0.2 μm occurs between a gap between the slanted portions and a gap between the flat portions. On the other hand, if the difference in the gap between the slanted portions and the flat portions are 0.1 μm or less, then a difference of approximately 0.1 μm to 0.2 μm occurs between the width of the slanted portion and the flat portion. However, this level of difference is within a practically acceptable range considering the manufacturing error of a mask (in general, 0.2 μm to 0.3 μm).

Effects of the Invention

The present invention can realize a display device that can suppress occurrence of defects due to a sealing member being uncured and occurrence of defective products due to shifts in alignment, and furthermore, variations in curing time of the sealing member and power consumption among display devices can be reduced in case a shift in alignment occurs.

DETAILED DESCRIPTION OF EMBODIMENTS

Embodiments are shown below and the present invention is described in further detail with reference to the drawings, but the present invention is not limited to these embodiments.

In the respective embodiments, the conductive layer having the source bus lines is also referred to as the source layer, and the conductive layer having the gate bus lines is also referred to as the gate layer.

In the respective embodiments, n and m are natural numbers.

In the present specification, a lead-out line (including a portion thereof) being disposed in a bent state refers to the following state. Such a state implies that if a virtual center line in the long side direction of a lead-out line (including a portion thereof) and a virtual line (straight line) that intersects with the virtual center line are defined, then, in a plan view, the virtual center line includes at least one first line located in one side of the virtual line and at least one second line located in another side of the virtual line, and that at least one first line and at least one second line are disposed alternately along the first direction (extending direction). Therefore, the lead-out line or a portion thereof in this state may be bent such as in a line graph shape, a triangle wave shape, or a trapezoid wave shape, or may be curved such as in a smoothed line shape or in a sine wave shape. In addition, in this state, the degree of bending (angle of bending or curvature, for example) of the lead-out line or a portion thereof is not limited in particular.

Embodiment 1

A display device of Embodiment 1 will be described with reference to FIGS. 1 to 5. First, the entire structure of the display device of Embodiment 1 will be described with reference to FIG. 1.

Figure 1:
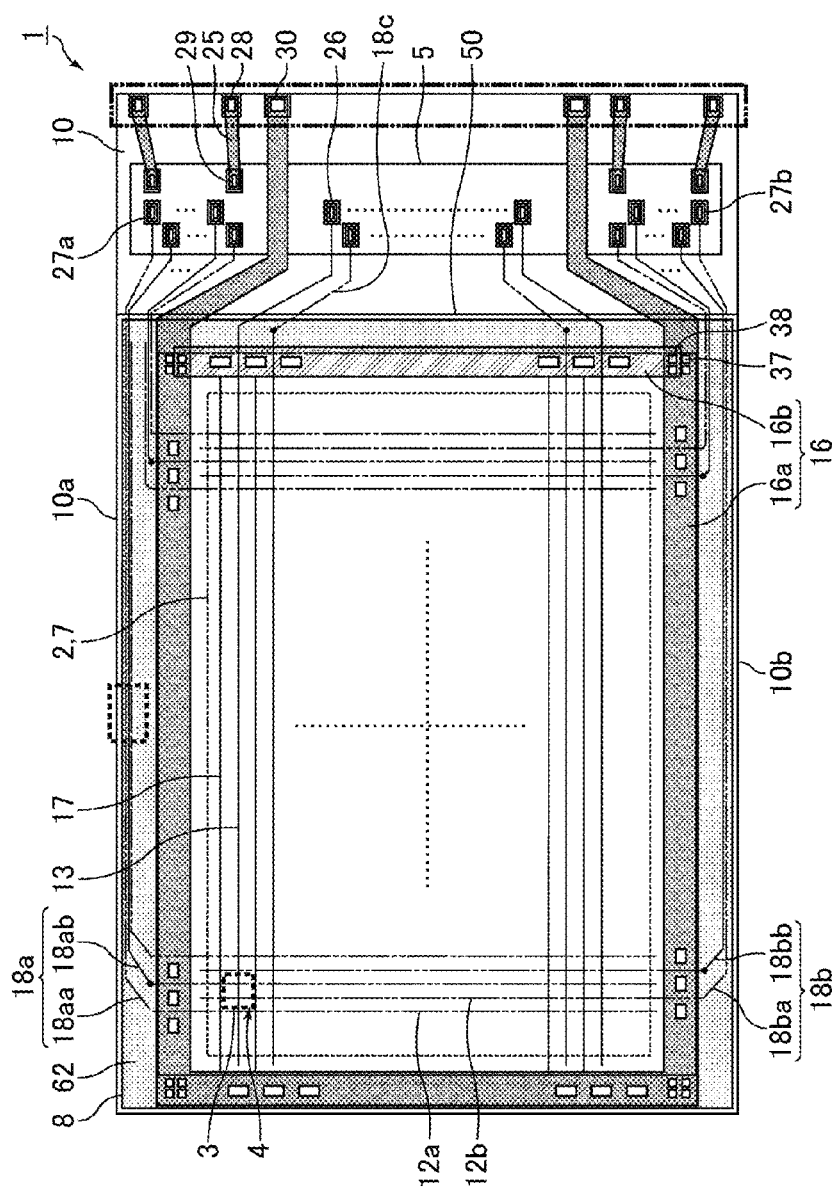
FIG. 1 is a schematic plan view of a liquid crystal panel included in a display device of Embodiment 1.

The display device of Embodiment 1 is a liquid crystal display that is active matrix driven and transmissive. As shown in FIG. 1, the display device has a liquid crystal panel 1, a backlight (not shown) disposed behind the liquid crystal panel 1, a control unit (not shown) that drives and controls the liquid crystal panel 1 and the backlight unit, and a flexible substrate (not shown) that connects the control unit to the liquid crystal panel 1.

The liquid crystal panel 1 includes a display unit 2 that displays images, and a plurality of pixels 3 are disposed on the display unit 2. The pixels 3 are disposed in a matrix along the row direction and the column direction. Each of the pixels 3 are formed of vertically long sub pixels 4 having a plurality of colors (three colors including red, green, and blue, for example).

The liquid crystal panel 1 includes an active matrix substrate (array substrate) 10, an opposite substrate 50 that faces the array substrate 10, a liquid crystal layer (not shown) and a seal 62 disposed between the substrates 10 and 50, an alignment film (not shown) disposed on a surface of the array substrate 10 on the liquid crystal layer side, an alignment film (not shown) disposed on a surface of the opposite substrate 50 on the liquid crystal layer side, and a driver chip 5 that is mounted on the array substrate 10 and that functions as a source driver and a gate driver. The liquid crystal panel 1, the array substrate 10, and the opposite substrate 50 include an area (display region) 7 corresponding to the display unit 2, and an area (frame region) 8 corresponding to the surrounding area of the display region 7. The driver chip 5 is a driving circuit for the source bus line and the gate bus line mentioned later.

The seal 62 is formed within the frame region 8 so as to surround the display region 7. The seal 62 attaches the substrates 10 and 50 to each other, and also seals the liquid crystal layer between the substrates 10 and 50.

The type of materials (sealing member) used for the seal 62 is not limited in particular, and an ordinary sealing member can be used such as a sealing member not having photocurable properties but having thermosetting properties (hereinafter, also referred to as thermosetting type sealing member), a sealing member having photocurable properties (ultraviolet curable properties, for example) but not having thermosetting properties (hereinafter, also referred to as photocurable type sealing member), and a sealing member having photocurable properties and thermosetting properties (hereinafter, photo-heat combination type sealing member). If the drip injection method (ODF method) is adopted as the method used for injecting liquid crystal, then the photocurable type sealing member and the photo-heat combination type sealing member are suitable for use. If the vacuum injection method is adopted, the thermosetting type sealing member is suitable for use. In general, the sealing members include acrylic resin and/or epoxy resin. The Photolec S series (Sekisui Chemical Co., Ltd.) that has the epoxy acrylic resin as a main component can be raised as a specific example of a photo-heat combination type sealing member.

The array substrate 10 is provided towards the rear of the liquid crystal display, and the opposite substrate 50 is provided towards the viewer side. Polarizing plates (not shown) are bonded on the surfaces of the substrates 10 and 50 opposite to the liquid crystal layer. These polarizing plates are generally disposed in a crossed Nicols state. The driver chip 5 is mounted on an area of the array substrate 10 that does not face the opposite substrate 50, or in other words, the area protruding from the opposite substrate 50 (hereinafter, protruding region) using COG (chip on glass) technology.

The array substrate 10 has terminals 26, 27a, 27b, 28, 29, and 30 within the protruding region, at least 4m number of source bus lines 12a and 12b vertically crossing the display region 7, at least 2n number of gate bus lines 13 horizontally crossing the display region 7, at least 2n number of common bus lines 17 horizontally crossing the display region 7, at least 2m number of lead-out lines 18a formed within the frame region 8, at least 2n number of lead-out lines 18c formed within the frame region 8, a common trunk wiring line 16 formed within the frame region 8 so as to surround the display region 7, and an input wiring line 25 formed within the frame region 8. Each of the gate bus lines 13 are connected to the first output section of the driver chip 5 through the corresponding lead-out lines 18c and the terminals 26. A flexible substrate is mounted in the region where the terminals 28 and 30 are provided (area surrounded by a bolded two-dot chain line in FIG. 1). The driver chip 5 has a plurality of input portions, and each input portion is supplied with signals or electricity from the control unit through the flexible substrate, the terminals 28, the input wiring lines 25, and the terminals 29. A common signal is supplied to the common trunk wiring line 16 from the control unit through the flexible substrate and the terminal 30. The common signal is a signal applied to all of the pixels. The common bus lines 17 are connected to the common trunk wiring lines 16 within the frame region 8, and a common signal is applied to the common bus line 17 from the common trunk wiring line 16.

The source bus lines 12a and 12b are disposed alternately and the lead-out lines 18a and 18b are respectively disposed on the upper side and the lower side of the display region 7. The respective source bus lines 12a are connected to the second output section of the driver chip 5 through the corresponding lead-out lines 18a and the terminals 27a. Each of the respective lead-out lines 18a extends from a corresponding source bus line towards an edge 10a of the array substrate 10, and then extends along the edge 10a towards the protruding region. Each of the source bus lines 12b is connected to the third output section of the driver chip 5 through the corresponding lead-out line 18b and the terminal 27b. Each of the respective lead-out lines 18b extends from a corresponding source bus line towards an edge 10b of the array substrate 10, and then extends along the edge 10b towards the protruding region. The edge 10b faces the edge 10a. At least a portion of the respective lead-out lines 18a and 18b are covered by the seal 62.

If the source bus line that is farthest away from the driver chip 5 is designated as the first source bus line, then the lead-out lines 18a include a lead-out line 18aa that is connected to the source bus line number $4m-3$, and a lead-out line 18ab connected to the source bus line number $4m-1$. On the other hand, the lead-out lines 18b include a lead-out line 18ba that is connected to the source bus line number $4m-2$, and a lead-out line 18bb connected to the source bus line number $4m$.

Each of the sub pixels 4 corresponds to an area delineated by the source bus lines 12a and 12b and the common bus lines 17 (hereinafter, also referred to as the sub pixel area).

The array substrate 10 has a plurality of TFTs (not shown) and a transparent pixel electrode (not shown) connected to each of the TFTs. A TFT and a pixel electrode are provided in each of the sub pixel areas. Each TFT is connected to the source bus line 12a or 12b and the gate bus line 13.

At least a portion of each of the lead-out lines 18aa and 18ba are provided in the source layer having the source bus lines 12a and 12b, and preferably, all of the respective lead-out lines 18aa and 18ba are provided in the source layer. On the other hand, at least a portion of the respective lead-out lines 18ab and 18bb are provided in the gate layer including the gate bus line 13. It is preferable that each of the lead-out lines 18ab and 18bb be located outside the common trunk wiring line 16, and include a portion provided in the gate layer, and a portion disposed in the source layer between the portion in the gate layer and the corresponding source bus line, in which all of these portions are connected to each other through a contact hole.

The lead-out line 18c includes a lead-out line provided in the source layer and a lead-out line provided in the gate layer, and these lead-out lines are disposed alternately.

The plan view pattern of the lead-out line 18a in the area where the seal 62 exists (area surrounded by bold dotted lines in FIG. 1) will be described with reference to FIGS. 2 to 4.

The lead-out line 18b is formed in a similar manner to the lead-out line 18a, and thus an explanation of the lead-out line 18b will be omitted.

Under the seal 62, the lead-out line 18aa is disposed in the gate layer and the lead-out line 18ab is disposed in the source layer, and the lead-out line 18ab is disposed so as to overlap a portion of the lead-out line 18aa. As shown in FIGS. 2 to 4, each of the lead-out lines 18aa and 18ab extend in a horizontal direction (direction corresponding to the first direction, hereinafter, also referred to as extending direction), and is disposed in a bent state in a plan view. The extending direction is substantially parallel to the edge 10a of the array substrate 10. The plurality of lead-out lines 18aa are disposed so as to be substantially parallel to each other, and are aligned in a direction (direction corresponding to the second direction) perpendicular to the extending direction. In addition, the plurality of lead-out lines 18ab are disposed so as to be substantially parallel to each other, and are aligned in a direction perpendicular to the extending direction.

The respective lead-out lines 18aa and 18ab are formed in a wave shape in a plan view. More specifically, each of the lead-out lines 18aa and 18ab are formed in a trapezoid wave shape in a plan view, and the lead-out lines 18aa and 18ab include a plurality of flat portions that are parallel to the extending direction, and a plurality of slanted portions that are at an angle with respect to the extending direction.

The position of the lead-out lines 18aa relative to the lead-out lines 18ab changes in a prescribed pattern. More specifically, in a plan view, each of the lead-out lines 18aa has a plurality of portions 41a (portion corresponding to the third portion) located on a side (upper side in FIG. 2) of the lead-out line 18ab, and a plurality of portions 41b (portion corresponding to the fourth portion) that are located on another side of the lead-out line 18ab. The portions 41a and 41b are disposed alternately along the extending direction. Furthermore, in a plan view, each of the lead-out lines 18ab has a plurality of portions 42a (portion corresponding to the fifth portion) located on a side (upper side in FIG. 2) of the lead-out line 18aa, and a plurality of portions 42b (portion corresponding to the sixth portion) located on another side (lower side in FIG. 2) of the lead-out line 18aa. The portions 42a and 42b are disposed alternately along the extending direction. In this manner, the portions 41a and 42a are respectively disposed so as to protrude from the upper side of the lead-out lines 18ab and 18aa, and the portions 41b and 42b are respectively disposed so as to protrude from the lower side of the lead-out lines 18ab and 18aa. If one of the lead-out lines 18aa and 18ab are rotated by 180° with respect to an axis parallel to the extending direction, then the lead-out line completely overlaps the other lead-out line.

Figure 2:
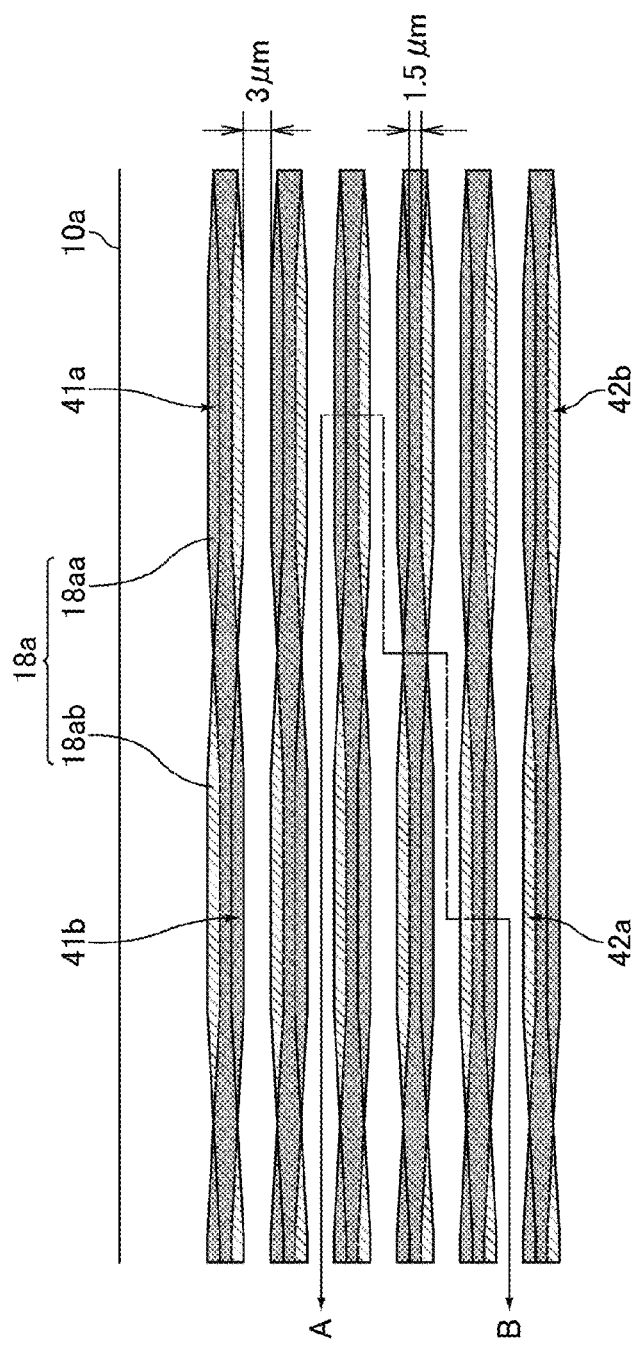
FIG. 2 is a schematic plan view of lead-out lines included in the display device of Embodiment 1.
Figure 3:
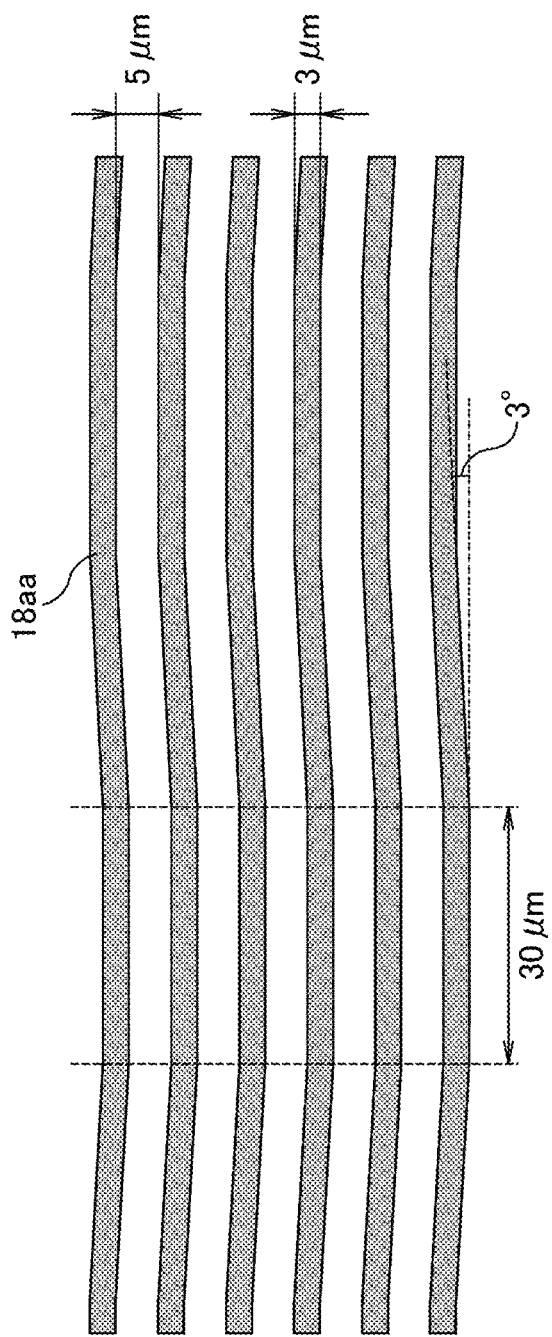
FIG. 3 is a schematic plan view of lead-out lines included in the display device of Embodiment 1.
Figure 4:
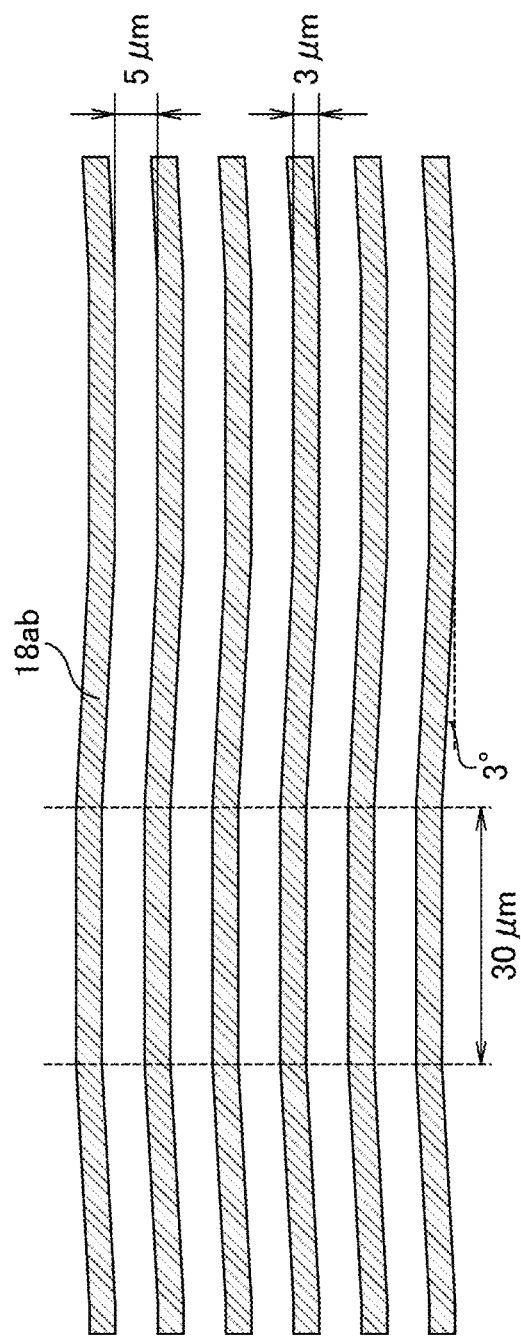
FIG. 4 is a schematic plan view of lead-out lines included in the display device of Embodiment 1.

The width of each of the lead-out lines 18aa and 18ab is not limited in particular, and can be set as appropriate, but the width may be set as 3 μm as shown in FIGS. 3 and 4, for example. The size of the gap between the respective lead-out lines 18aa and the gap between the respective lead-out lines 18ab are not limited in particular, and can be set as appropriate, but the gap may be set as 5 μm as shown in FIGS. 3 and 4, for example. As shown in FIG. 2, the width of the light transmissive portion is not limited in particular, and can be set as appropriate, but the width may be set as 3 μm as shown in FIG. 2, for example. The width of the overlapping area between the flat portions of the lead-out lines 18ab and 18aa are not limited in particular, and can be set as appropriate, but the width may be set as 1.5 μm as shown in FIG. 2, for example. The length of the flat portions is not limited, and can be set as appropriate, but the length may be set as 30 μm as shown in FIGS. 3 and 4, for example. The respective lead-out lines 18*aa* and 18*ab* may be formed without a flat portion so as to be in a triangle wave shape in a plan view. The angle between the extending direction and the slanted portion is not limited in particular, and can be set as appropriate, but the angle may be set as approximately 3° as shown in FIGS. 3 and 4, for example.

Next, the cross-sectional structure of the liquid crystal panel 1 will be described with reference to FIG. 5.

Figure 5:
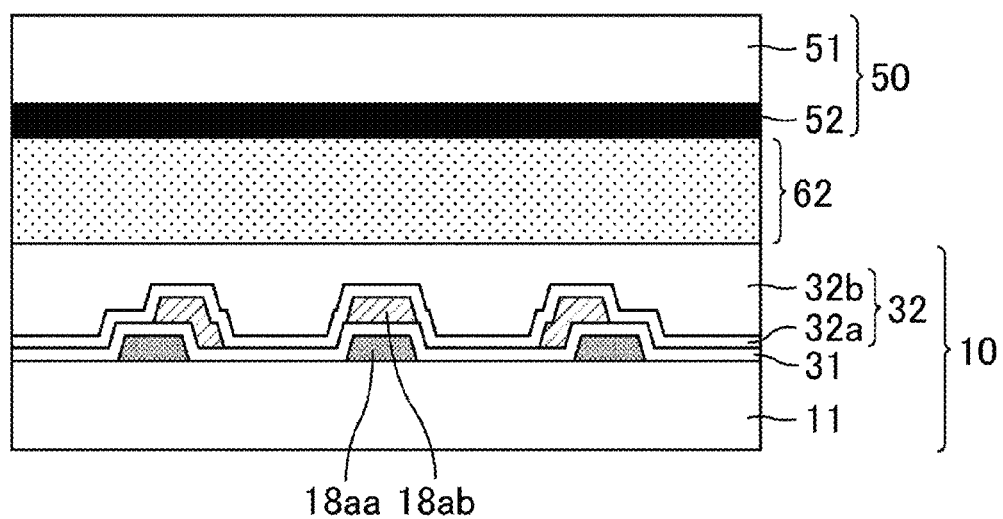
FIG. 5 is a schematic cross-sectional view of FIG. 2 along a line A-B of a liquid crystal panel included in the display device of Embodiment 1.

As shown in FIG. 5, the array substrate 10 has a transparent insulating substrate 11 such as a glass substrate or a plastic substrate. A gate layer is formed on the insulating substrate 11, and a portion of the lead-out line 18*ab*, a portion of the lead-out line 18*bb*, the gate bus line 13, the common bus line 17, and the input wiring line are provided in the gate layer. As shown in FIG. 1, the portion 16*a* of the common trunk wiring line 16 (hereinafter, also referred to as lower layer portion) that intersects the lead-out lines 18*a* and 18*b* is also provided in the gate layer. The gate layer is formed of a conductive film including materials such as molybdenum (Mo), titanium (Ti), aluminum (Al), copper (Cu), or an alloy of these. The gate layer may be formed of a multilayer film of these conductive films.

A gate insulating film 31 is formed on the gate layer. The gate insulating film 31 is formed of an insulating film including an inorganic material such as silicon nitride (SiNx) or silicon oxide. The gate insulating film 31 may be formed of a multilayer film of these insulating films.

A semiconductor layer (not shown) is formed on the gate insulating film 31. Elements Group 14 semiconductors such as silicon, oxide semiconductors, and the like can be used as a material for the semiconductor layer, but oxide semiconductors are more suitable. It is preferable that the oxide semiconductor have at least one of an element in a group including indium (In), gallium (Ga), zinc (Zn), aluminum (Al), and silicon (Si), along with oxygen (O), and it is preferable that the oxide semiconductor includes In, Ga, Zn, and O. If an oxide semiconductor is used, then the mobility of the TFT can be made higher than if amorphous silicon is used. As a result, sufficient voltage can be applied to the liquid crystal layer even if the definition increases, or in other words, even if the ON time of the TFT of each sub pixel (or pixel) is shortened. Furthermore, if an oxide semiconductor is used, then compared to if an amorphous silicon is used, the leakage current in an OFF state of the TFT can be reduced. Thus, regardless of the definition being high or not, driving methods such as low frequency driving and driving provided with a stop period can be adopted, and as a result, the power consumption can be reduced. The crystalline structure of the semiconductor layer is not limited in particular, and the semiconductor layer may be monocrystalline, polycrystalline, amorphous, or microcrystalline, and may include two or more of these crystalline structures.

A source layer is formed on the gate insulating film 31 and the semiconductor layer, and the lead-out lines 18*aa* and 18*ba*, the source bus lines 12*a* and 12*b*, and the drain electrode (not shown) of the TFT are formed in the source layer. Furthermore, as shown in FIG. 1, other than the lower layer portion 16*a*, the common trunk wiring lines 16 has a portion (hereinafter, upper layer portion) 16*b* intersecting the lead-out lines 18*c* also provided in the source layer. The source layer is formed of a conductive film including materials such as Mo, Ti, Al, Cu, or an alloy of these. The source layer may be formed of a multilayer film of these conductive films.

An interlayer insulating film 32 is formed on the source layer and the pixel electrodes. The interlayer insulating film 32 includes an inorganic insulating film 32*a* and an organic insulating film 32*b* layered on the interlayer insulating film 32*a*. Possible materials for the inorganic insulating film 32*a* include inorganic insulating materials such as silicon nitride (SiNx) or silicon oxide, for example. Photosensitive resin such as photosensitive acrylic resin can be used as a material of the organic insulating film 32*b*, for example. The interlayer insulating film 32 does not need to include the organic insulating film 32*b*.

The pixel electrode is formed on the interlayer insulating film 32, and is connected to the drain electrode through a contact hole (not shown) that penetrates the interlayer insulating film 32. Possible materials for the pixel electrode include transparent conductive materials such as indium tin oxide (ITO) and indium zinc oxide (IZO), for example. In some cases, the pixel electrode is formed on the gate insulating film 31. In this case, a portion of the pixel electrode is connected to the drain electrode by overlapping the drain electrode.

As shown in FIGS. 2 and 5, under the seal 62, the lead-out line 18*b* partially overlaps the lead-out line 18*a*.

As shown in FIG. 1, the lower layer portion 16*a* and the upper layer portion 16*b* of the common trunk wiring line 16 are connected to each other through a transparent conductive member (not shown) provided on the interlayer insulating film 32. More specifically, the transparent conductive member is connected to the lower layer portion 16*a* through the contact hole 37 penetrating the gate insulating film 31 and the interlayer insulating film 32, and the transparent conductive member is connected to the upper layer portion 16*b* through the contact hole 38 penetrating the interlayer insulating film 32.

As shown in FIG. 5, the opposite substrate 50 has a transparent insulating substrate 51 such as a glass substrate or a plastic substrate, a black matrix (BM) 52 that functions as a light-shielding member, color filters having a plurality of colors (not shown), and a plurality of spacers (not shown) having a pillar shape. The BM 52 is formed so as to shield light for the frame region 8 and the area opposing the bus line. Each of the color filters is provided in the display region 7, and formed so as to cover the area demarcated by the BM 52, or in other words, the opening of the BM 52. The opposite substrate 50 may have an overcoat film that covers all of the color filters. The pillar shaped spacer is disposed within the light-shielding area of the BM 52

In the present embodiment, the liquid crystal mode is not limited in particular, but if the liquid crystal mode is a type that uses vertical electric fields such as TN (twisted nematic) mode, VA (vertical alignment) mode, and MVA (multi-domain vertical alignment) mode, then, in general, the opposite substrate 50 has an opposite electrode to which a common signal is applied on the BM 52 and the color filters.

In the present embodiment, in an area overlapping the seal 62, the lead-out lines 18*aa* and 18*ba* are provided in the source layer, and the lead-out lines 18*ab* and 18*bb* are provided in the gate layer, and the lead-out lines 18*ab* and 18*bb* partially overlap the lead-out lines 18*aa* and 18*ba*, respectively. Therefore, the light transmissive region can be sufficiently secured.

The portions 41*a* and 41*b* are disposed alternately along the extending direction, and the portions 42*a* and 42*b* are disposed alternately along the extending direction. Furthermore, the lead-out line 18*b* is also formed in a similar manner to the lead-out line 18*a*. As a result, even if a shift in alignment of the gate layer and/or the source layer takes place, and the area of one of the portions 41*a* and 41*b* decreases, the area of the other portion increases. The same can be said for the portions 42*a* and 42*b*. Therefore, the manufacturing of a product with greater parasitic capacitance than a standard product manufactured in accordance with the blueprint can be prevented, and variation in the characteristic value (area of the light transmissive region, size of the parasitic capacitance, and the like, for example) of each product can be reduced. These effects can be obtained regardless of the direction of the alignment shift unless the alignment shifts in the exact same direction as the extending direction.

The lead-out lines 18aa and 18ab are respectively disposed in a bent state, and thus the parasitic capacitance of the present embodiment can be made even smaller compared to Embodiment 2 mentioned later.

Furthermore, each of the lead-out lines 18aa and 18ab are formed in a wave shape in a plan view. As a result, in the checking process of the array substrate, by using die-to-die comparison that compares the same adjacent patterns, the presence or absence of the lead-out lines 18aa and 18ab (disconnection defect, leak defect, or the like, for example) can be tested. It is preferable that each of the lead-out lines 18aa and 18ab be formed such that a same shape (repeating unit) is repeated (repeated shape). As a result, a die-to-die comparison can be efficiently performed for the smallest repeating unit or for a plurality of repeating units.

Furthermore, each of the lead-out lines 18aa and 18ab are formed in a trapezoid wave shape in a plan view, and the lead-out lines 18aa and 18ab have flat portions. As a result, the present embodiment can reduce the number of times that each of the lead-out lines bend and can secure a larger light transmissive region compared to Embodiments 2 and 5 mentioned later. This pattern is suitable for a portion of a lead-out line that extends for a long distance such as the portion of a lead-out line extending along an edge of the array substrate.

Embodiment 2

A display device of Embodiment 2 will be described with reference to FIG. 6.

The present embodiment is substantially the same as Embodiment 1 except that the plan view pattern of the lead-out lines under a seal is different. Therefore, in the present embodiment, mainly the characteristics particular to the present embodiment will be described, and explanations covered in Embodiment 1 will be omitted.

Figure 6:
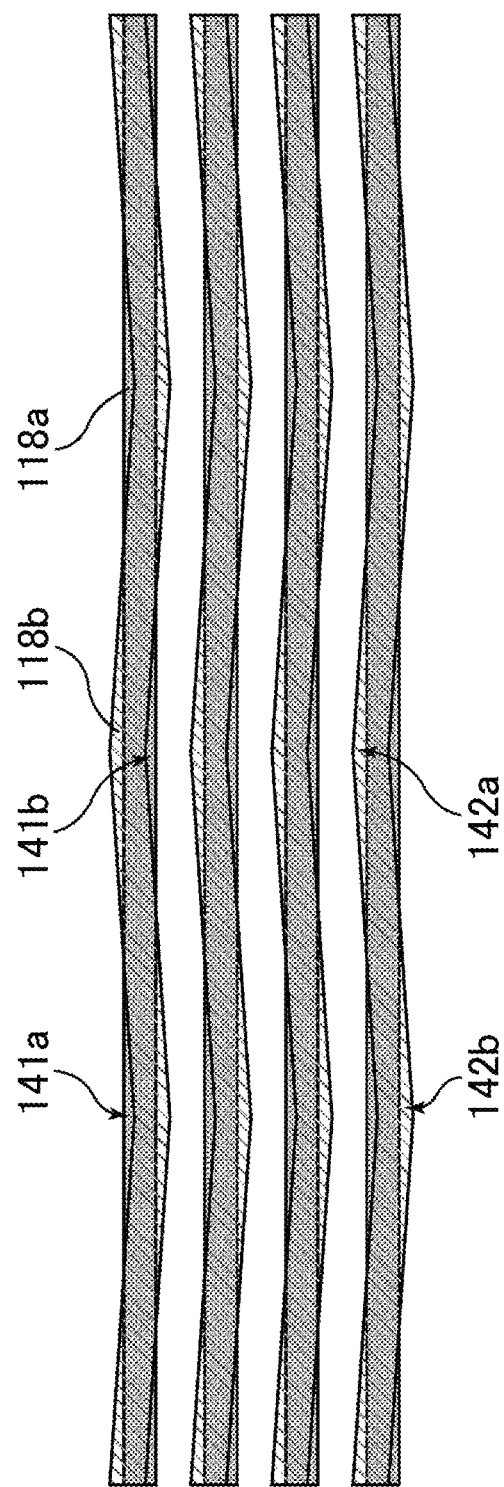
FIG. 6 is a schematic plan view of lead-out lines included in a display device of Embodiment 2.

As shown in FIG. 6, the display device of the present embodiment has a lead-out line 118a that corresponds to the lead-out lines 18aa and 18ba, and a lead-out line 118b that corresponds to lead-out lines 18ab and 18bb. Under a seal (not shown), the lead-out line 118a is provided in the gate layer, and the lead-out line 118b is provided in the source layer, the lead out line 118b partially overlapping the lead-out line 118a. Thus, sufficient light transmissive region can be secured.

The lead-out line 118b is formed in a triangle wave shape and is disposed so as to be bent in a zigzag state, but the lead-out line 118a is formed in a straight line. Each of the lead-out lines 118b does not have a flat portion that is parallel to the extending direction, and has a plurality of slanted portions that extend diagonally with respect to the extending direction. On the other hand, the lead-out line 118a may be formed in a triangle wave shape and the lead-out line 118b may be formed in a straight line.

Furthermore, the position of the lead-out line 118b relative to the lead-out line 118a changes in a prescribed pattern. More specifically, the lead-out line 118a has a plurality of portions 141a (portions corresponding to the third portion) located on a side of the lead-out line 118b, and a plurality of portions 141b (portions corresponding to the fourth portion) located on another side (bottom side in FIG. 6) of the lead-out line 118b, the portions 141a and 141b being disposed alternately along the extending direction, in a plan view. In addition, the lead-out line 118b has a plurality of portions 142a (portions corresponding to the fifth portion) located on a side of the lead-out line 118a, and a plurality of portions 142b (portions corresponding to the sixth portion) located on another side (bottom side in FIG. 6) of the lead-out line 118a, the portions 142a and 142b being disposed alternately along the extending direction, in a plan view. Therefore, in a similar manner to Embodiment 1, the manufacturing of a product having greater parasitic capacitance than a standard product manufactured according to the blueprint can be prevented, and the variation in the characteristic value (area of the light transmissive region, size of the parasitic capacitance, and the like, for example) of each product can be reduced.

(Testing Effects of Embodiment 1 and 2)

Figure 7:
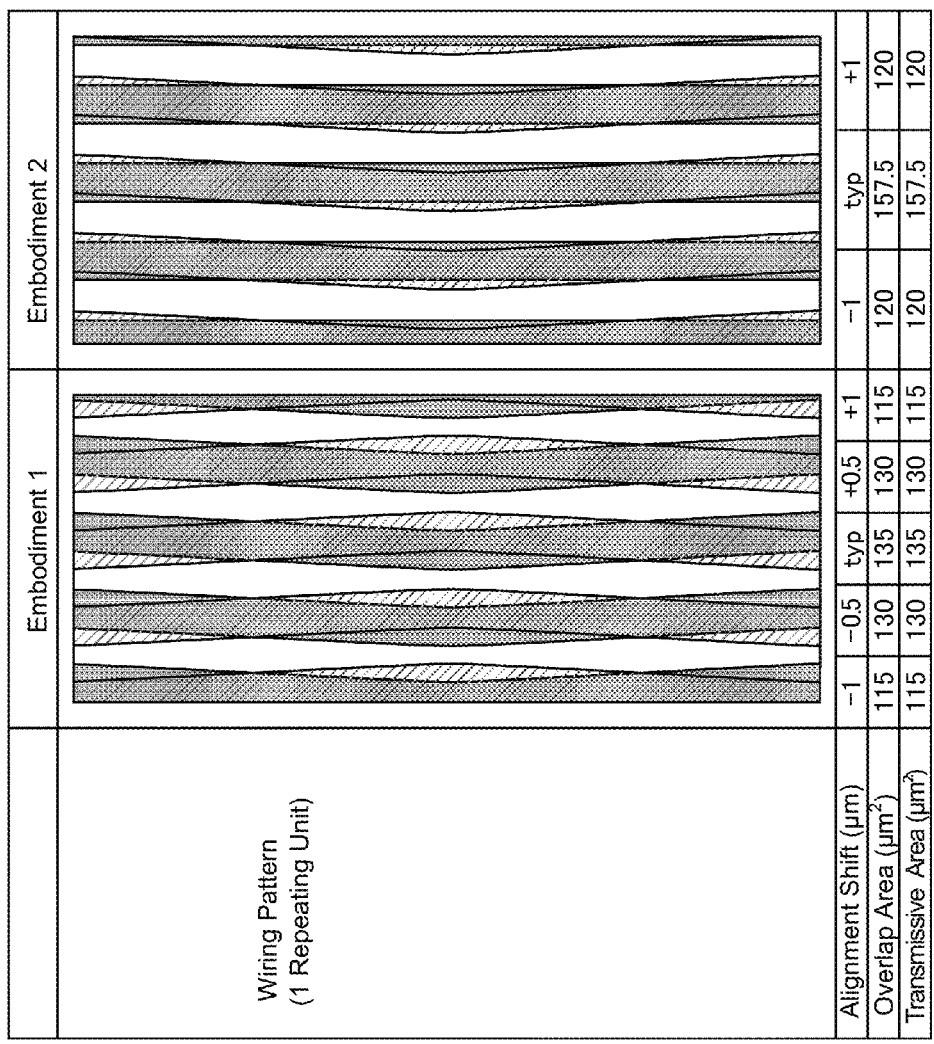
FIG. 7 shows the results of the measurements performed regarding the overlapping area and the light transmissive portion area for each of the plan view patterns of the lead-out lines related to Embodiments 1 and 2.
Figure 8:
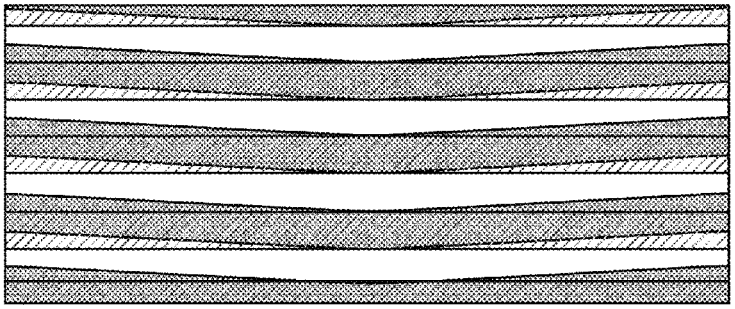
FIG. 8 shows the results of the measurements performed regarding the overlapping area and the light transmissive portion area for each of the plan view patterns of the lead-out lines related to Comparison Examples 1 to 3.

Results of testing the effects of Embodiments 1 and 2 will be explained with reference to FIGS. 7 and 8. In FIGS. 7 and 8, the results of the measurements performed regarding the plan view pattern of the lead-out lines related to Embodiments 1 and 2, Comparison Examples 1 to 3, and the overlapping area of the respective patterns and the light transmissive area can be shown.

In the pattern in Comparison Example 1, the lead-out line provided in the gate layer and the lead-out line provided in the source layer are both formed in a straight line, and the lead out line provided in the source layer completely overlaps the lead-out line provided in the gate layer.

In the pattern in Comparison Example 2, the lead-out line provided in the gate layer and the lead-out line provided in the source layer are both formed in a straight line, and the lead out line provided in the source layer partially overlaps the lead-out line provided in the gate layer.

In the pattern related of Comparison Example 3, the lead-out line provided in the gate layer is formed in a zigzag pattern, and the lead-out line provided in the source layer is formed in a straight line. The lead-out line of the gate layer has a portion that is located on the right side of the lead-out line of the source layer, but does not have a portion located on the left side. The lead-out line of the source layer has a portion that is located on the left side of the lead-out line of the gate layer, but does not have a portion located on the right side.

The pattern of Embodiment 1 has a lead-out line provided in the gate layer, and a lead-out line provided in the source layer formed in a zigzag pattern. In the pattern in Embodiment 2, the lead-out line provided in the source layer is formed in a zigzag pattern, and the lead-out line provided in the gate layer is formed in a straight line. In Embodiments 1 and 2, the location of the lead-out line in the source layer relative to the lead-out line in the gate layer changes in a prescribed pattern.

In each of the patterns, the width of each of the lead-out lines is set to be 3 μm and the gap between the lead-out lines provided in the same layer is set to be 3 μm. In FIGS. 7 and 8, the overlapping area is an area in which the lead-out line of the gate layer and the lead-out line of the source layer overlap each other, and the light transmissive area is an area in which neither of the lead-out lines exists. The size of the capacitance (parasitic capacitance) formed by the lead-out line of the gate layer and the lead-out line of the source layer is proportionate to the size of the overlapping area.

First, the overlapping area and the light transmissive area of the respective patterns shown in FIGS. 7 and 8 were measured (see column labeled typ). The results correspond to that of a standard product manufactured according to the blue print. Furthermore, the overlapping area and the light transmissive area were measured for a pattern in which the lead-out line of the gate layer or the lead-out line of the source layer is moved for a prescribed distance (value written in the amount of alignment shifting section) in a horizontal direction in FIGS. 7 and 8. This result is an equivalent of a case in which the alignment of the gate layer and/or the source layer did not go as planned during the photolithography process when manufacturing the array substrate.

As a result, it was found that in the pattern related to Comparison Example 1, the area of the light transmissive portion can be sufficiently secured, but the power consumption increases because the parasitic capacitance is large.

In the pattern of Comparison Examples 2 and 3, the parasitic capacitance can be made smaller, and the area of the light transmissive portion can be secured. However, it was found that the change in overlapping area and the light transmissive area is large if the alignment shifts. Furthermore, there is a possibility that a product having even greater parasitic capacitance compared to a standard product would be formed. If a standard product having an overlapping area of 135 $\mu m^2$ is not a defective product, and if a product having an overlapping area of 155 $\mu m^2$ is a defective product, then there is a possibility that a defective product will be formed in Comparison Examples 2 and 3 due to shifts in alignment, for example.

In the patterns related to Embodiments 1 and 2, the light transmissive area can be secured. Furthermore, it was found that the change in overlapping area and the light transmissive area is small if the alignment shifts. In addition, even if the alignment shifts, a product having a larger parasitic capacitance than a standard product will not be manufactured. As a result, in a case in which a standard product having an overlapping area of 135 $\mu m^2$ is not a defective product, a defective product due to shifts in alignment in Embodiments 1 and 2 will not occur.

Figure 19:
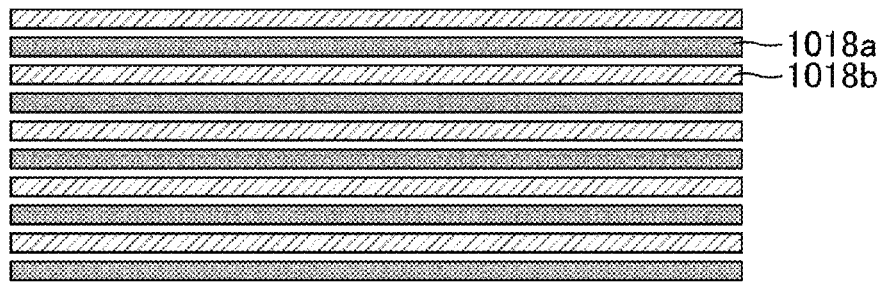
FIG. 19 is a schematic plan view of lead-out lines included in a display device of Comparison Example 1.
Figure 20:
FIG. 20 is a schematic plan view of lead-out lines included in a display device of Comparison Example 1.
Figure 21:
FIG. 21 is a schematic plan view of lead-out lines included in a display device of Comparison Example 2.
Figure 22:
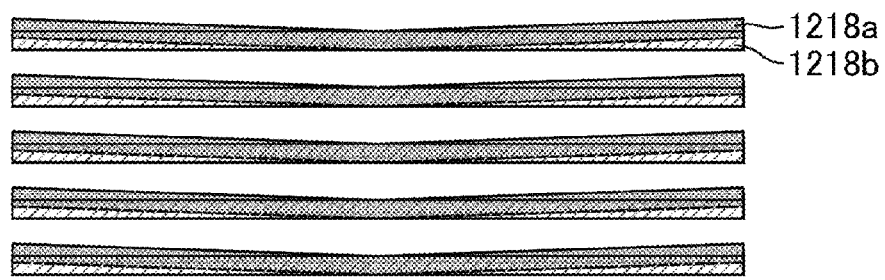
FIG. 22 is a schematic plan view of lead-out lines included in a display device of Comparison Example 3.

Furthermore, compared to a pattern shown in FIG. 19, the patterns of Embodiments 1 and 2 has an advantage in that the seal can be tested more easily. In general, a seal test involves examining whether the position of the seal and the width thereof is appropriate, whether the seal has disconnections, whether the sealing member is cured sufficiently, and the like by observation equipment such as a microscope.

The pattern of Embodiment 1 has a smaller capacitance compared to a pattern of Embodiment 2, and it has been found that Embodiment 1 has an advantage over Embodiment 2 in terms of decreasing power consumption.

Embodiment 3

Figure 9:
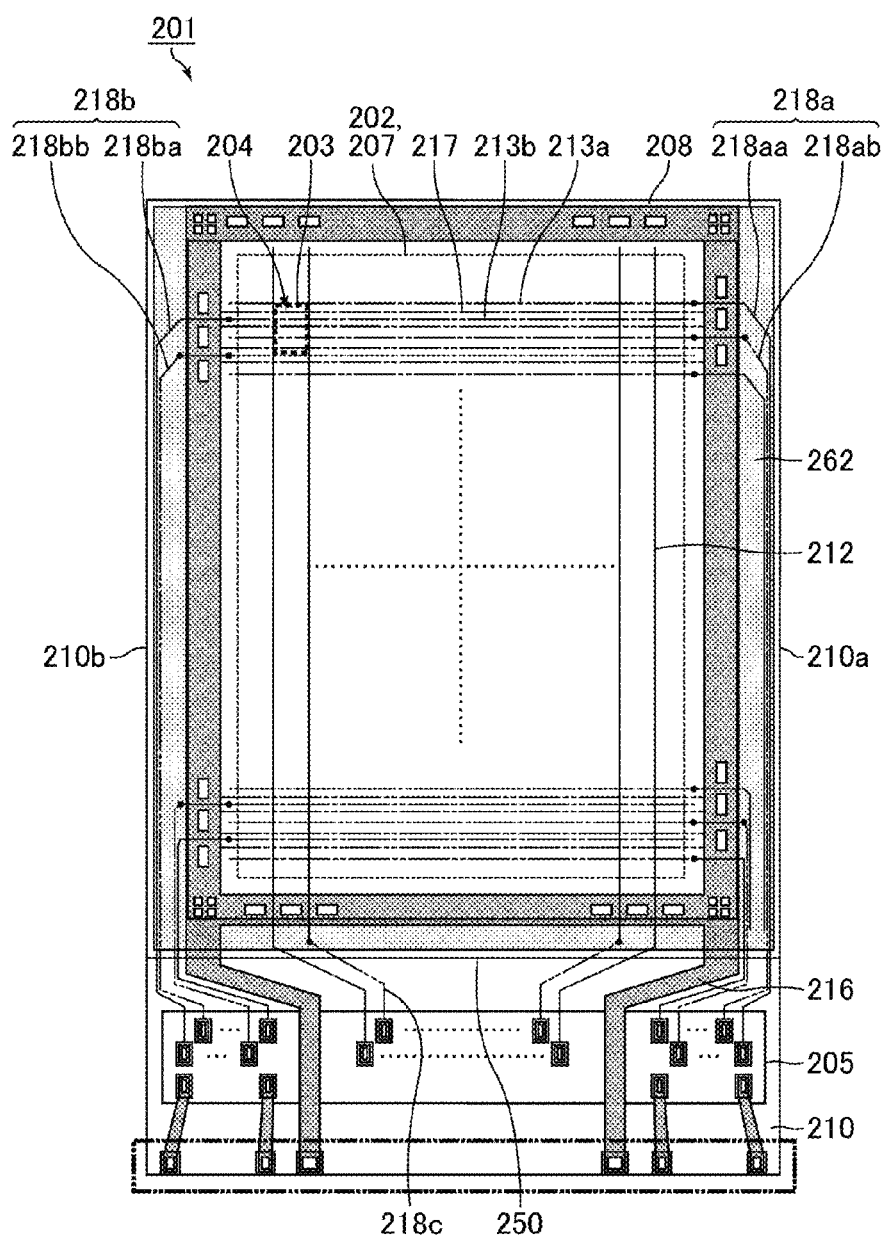
FIG. 9 is a schematic plan view of a liquid crystal panel included in a display device of Embodiment 3.

Next, with reference to FIG. 9, the display device of Embodiment 3 will be explained.

In the present embodiment, the particular pattern of the lead-out line mentioned above is not a lead-out line for the source bus line, but a lead-out line for the gate bus line. In the present embodiment, mainly the characteristics particular to the present embodiment will be described, and explanations covered in Embodiment 1 will be omitted.

A liquid crystal panel 201 included in the present embodiment has a display unit 202, and a plurality of pixels 203 are disposed on the display unit 202. Each of the pixels 203 is formed of horizontally long sub pixels 204 having a plurality of colors (three colors including red, green, and blue, for example).

The liquid crystal panel 201 has an array substrate 210, an opposite substrate 250, a seal 262, and a driver chip 205 that functions as a source driver and a gate driver. Furthermore, the liquid crystal panel 201, the array substrate 210, and the opposite substrate 250 include an area (display region) 207 corresponding to the display unit 202, and a region (frame region) 208 surrounding the display region 207.

The array substrate 210 includes at least $2m$ number of source bus lines 212, at least $4n$ number of gate bus lines 213a and 213b, at least $4n$ number of common bus lines 217, at least $2n$ number of lead-out lines 218a, at least $2n$ number of lead-out lines 218b, at least $2m$ number of lead-out lines 218c, and a common trunk wiring line 216 provided in the gate layer. Each of the source bus lines 212 are connected to the corresponding lead-out lines 218c. In FIG. 9, a flexible substrate is mounted in an area surrounded by a bolded two-dot chain line.

The gate bus lines 213a and 213b are disposed alternately, and the lead-out lines 218a and 218b are respectively disposed on the right side and the left side of the display region 207. Each of the gate bus lines 213a are connected to the corresponding lead-out lines 218a. Each of the lead-out lines 218a extends from the corresponding gate bus line to an edge 210a of the array substrate 210, and extends towards the protruding region along the edge 210a. Each of the gate bus lines 213b is connected to the corresponding lead-out lines 218b. Each of the lead-out lines 218b extends from the corresponding gate bus line to an edge 210b of the array substrate 210, and extends towards the protruding region along the edge 210b. At least a portion of each of the lead-out lines 218a and 218b is covered by the seal 262.

If the gate bus line that is farthest away from the driver chip is the first gate bus line, then the lead-out lines 218a includes a lead-out line 218aa connected to gate bus line number $4n-3$ and a lead-out line 218ab connected to gate bus line number $4n-1$. On the other hand, the lead-out lines 218b includes a lead-out line 218ba connected to the gate bus line number $4n-2$, and a lead-out line 218bb connected to the gate bus line number $4n$.

At least a portion of each of the lead-out lines 218aa and 218ba are provided in the source layer, and preferably, almost all of the respective lead-out lines 218aa and 218ba are provided in the source layer. On the other hand, at least a portion of each of the lead-out lines 218ab and 218bb is provided in the gate layer. It is preferable that the respective lead-out lines 218ab and 218bb include a portion in an outer side (hereinafter, also referred to as outer side portion) of the common trunk wiring line 216, a portion intersecting (hereinafter, also referred to as intersection) the common trunk wiring line 216, and a portion corresponding to the portion (hereinafter, also referred to as connecting portion) between the intersection and the gate bus lines. The outer side portion is provided in the gate layer, the intersection is provided in the source layer, and the connecting portion is provided in the gate layer. The outer side portion and the intersection are connected to each other through the contact hole, and the intersection and the connecting portion are connected to each other through the contact hole.

The lead-out line 218c includes a lead-out line provided in the source layer and a lead-out line provided in the gate layer. These lead out lines are disposed alternately.

In the present embodiment, the lead-out lines 218a and 218b of Embodiment 1 have a similar plan view pattern under the seal 262. Therefore, the present embodiment can also achieve a similar effect to that of Embodiment 1.

Embodiment 4

The display device of Embodiment 4 will be explained with reference to FIG. 10.

The present embodiment has the characteristic pattern mentioned above of the lead-out line provided in another conductive layer that is not the gate layer and the source layer. In the present embodiment, mainly the characteristics particular to the present embodiment will be described, and explanations covered in Embodiment 1 will be omitted.

The display device of the present embodiment is a liquid crystal display of a fringe field switching (FFS) type that is a type of a horizontal alignment mode liquid crystal display. In the horizontal alignment mode, the orientation of the liquid crystal molecules is controlled by applying an electric field (horizontal electric field) that is in a horizontal direction (parallel direction) to the substrate surface to liquid crystal molecules having positive or negative dielectric anisotropy.

Figure 10:
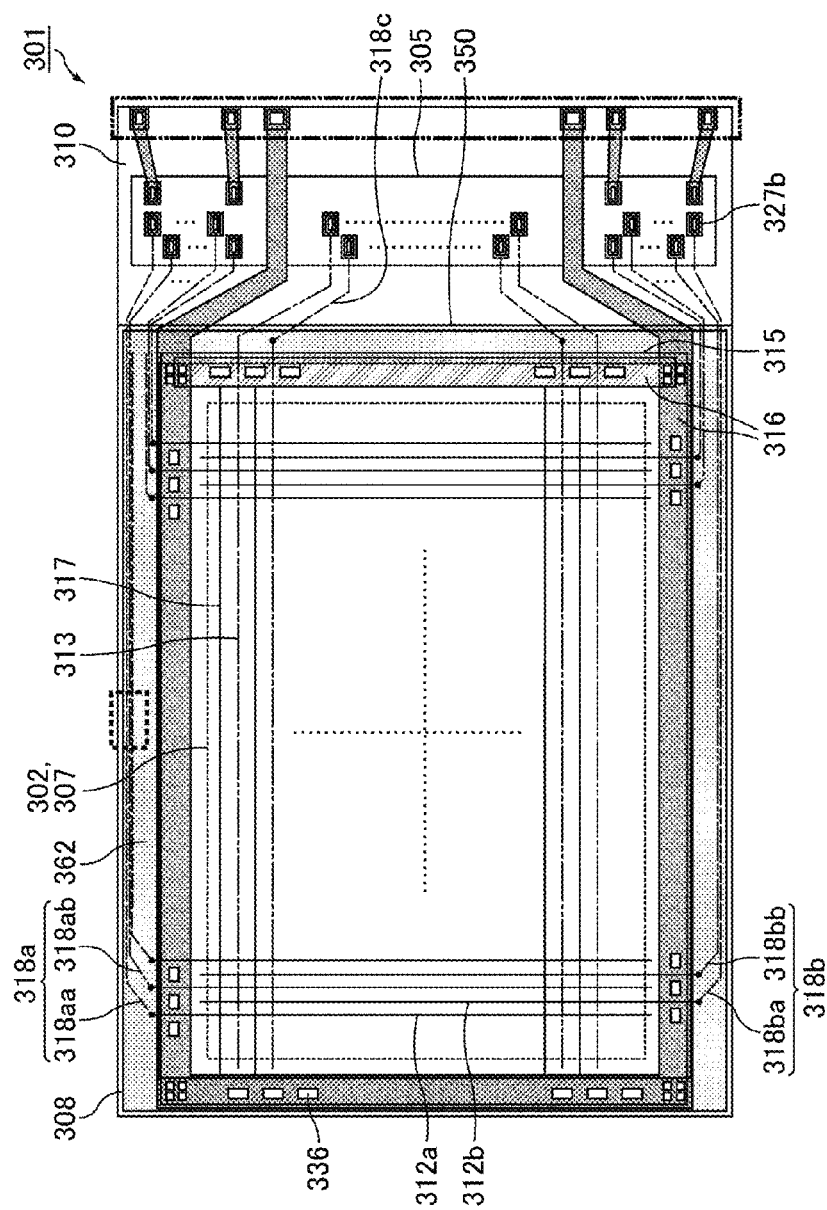
FIG. 10 is a schematic plan view of a liquid crystal panel included in a display device of Embodiment 4.

As shown in FIG. 10, a liquid crystal panel 301 included in the display device of the present embodiment has a display unit 302, and the liquid crystal panel 301 includes an array substrate 310, an opposite substrate 350, a seal 362, a horizontal alignment film (not shown) provided on a surface of the array substrate 310 on the liquid crystal layer side, a horizontal alignment film (not shown) provided on a surface of the opposite substrate 350 on the liquid crystal layer side, and a driver chip 305 that functions as a source driver and a gate driver. Furthermore, the liquid crystal panel 301, the array substrate 310, and the opposite substrate 350 have an area (display region) 307 corresponding to the display unit 302, and an area (frame region) 308 surrounding the display region 307.

The array substrate 310 has a transparent common electrode 315 formed so as to cover all of the sub pixel area, or in other words, the display region 307, at least $4m$ number of source bus lines 312a and 312b, at least $2n$ number of gate bus lines 313, at least $2n$ number of common bus lines 317, at least $2m$ number of lead-out lines 318a, at least $2m$ number of lead-out lines 318b, at least $2n$ number of lead-out lines 318c, and a common trunk wiring line 316. Each of the gate bus lines 313 is connected to the corresponding lead-out line 318c. In FIG. 10, a flexible substrate is mounted in an area surrounded by a bolded two-dot chain line.

In the common electrode 315, in each of the sub pixel area, slits that are parallel to each other (long and narrow opening, not shown) are formed. Within the frame region 308, the common electrode 315 is connected to the common trunk wiring line 316 through the contact hole 336 formed in the common trunk wiring line 316, and a common signal is applied to the common electrode 315 from the common trunk wiring line 316.

Furthermore, the common bus line 317 is provided directly above or below the common electrode 315, and is connected to the common electrode 315 by being in direct contact to the common electrode 315. The common bus lines 317 are provided so as to reduce the resistance of the common electrode 315, and are provided to suppress display defects such as shadowing.

If the source bus line that is farthest away from the driver chip 305 is the first source bus line, then the lead-out line 318a includes a lead-out line 318aa connected to the source bus line number $4m-3$, and a lead-out line 318ab connected to the source bus line number $4m-1$. On the other hand, the lead-out line 318b includes the lead-out line 318ba connected to the source bus line number $4m-2$, and a lead-out line 318bb connected to the source bus line number $4m$.

At least a portion of each of the lead-out lines 318aa and 318ba are provided in a conductive layer that includes the common bus line 317 (hereinafter, also referred to as common layer). It is preferable that each of the lead-out lines 318aa and 318ba be located outside the common trunk wiring line 316 and include a portion provided in the common layer, a portion located between the portion in the common layer and corresponding source bus lines, and a portion provided in the source layer. These portions are connected to each other through a contact hole. On the other hand, at least a portion of each of the lead-out lines 318ab and 318bb are provided in the gate layer. It is preferable that each of the lead-out lines 318ab and 318bb be located outside the common trunk wiring line 316, and include a portion provided in the gate layer, and a portion disposed in the source layer between the portion in the gate layer and the corresponding source bus line, in which all of these portions are connected to each other through a contact hole.

The lead-out line 318c includes a lead-out line provided in a common layer and a lead-out line provided in a gate layer, and these lead-out lines are disposed alternately.

The plan view pattern of the lead-out line 318a of the area where the seal 362 exists (area surrounded by bold dotted lines in FIG. 10) will be described with reference to FIG. 11. The lead-out line 318b is formed in a similar manner to the lead-out line 318a, and therefore descriptions of the lead-out line 318b will be omitted.

Under the seal 362, the lead-out line 318aa is provided in the gate layer, and the lead-out line 318ab is provided in the common layer. As shown in FIG. 11, each of the lead-out lines 318aa and 318ab extend in a horizontal direction (direction corresponding to the first direction, hereinafter, also referred to as extending direction), and is disposed in a bent state in a plan view. The plurality of lead-out lines 318aa are disposed so as to be substantially parallel to each other, and are aligned in a direction (direction corresponding to the second direction) perpendicular to the extending direction. In addition, the plurality of lead-out lines 318ab are disposed so as to be substantially parallel to each other, and are aligned in a direction perpendicular to the extending direction.

In addition, each of the lead-out lines 318aa and 318ab is formed in a trapezoid wave shape in a plan view, and the lead-out lines 318aa and 318ab include a plurality of flat portions that are parallel to the extending direction, and a plurality of slanted portions that are at an angle with respect to the extending direction.

Furthermore, the position of the lead-out line 318ab relative to the lead-out line 318aa changes in a prescribed pattern.

Figure 11:
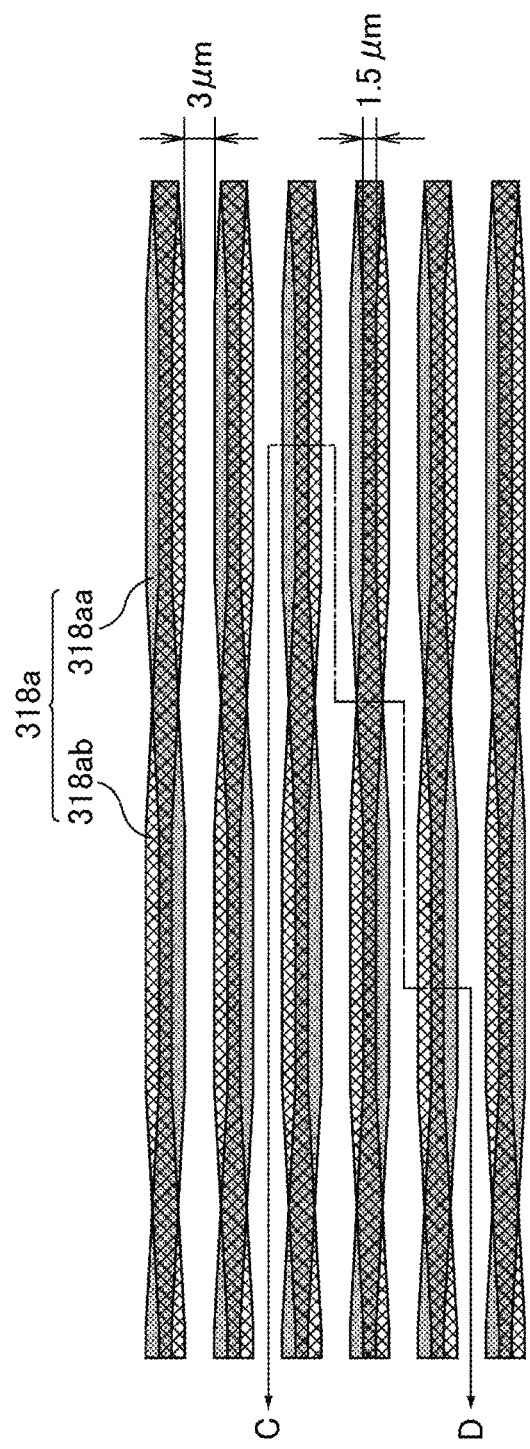
FIG. 11 is a schematic plan view of lead-out lines included in a display device of Embodiment 4.

As shown in FIG. 11, the width of the light transmissive portion is not limited in particular, and can be set as appropriate, but the width may be set as 3 μm as shown in FIG. 11, for example. As shown in FIG. 11, the width of the area in which the flat portion of the lead-out line 318ab and the flat portion of the lead-out line 318aa overlap each other can be set as appropriate, but may be set as 1.5 μm, for example.

In the present embodiment, the lead-out line 318ab partially overlaps the lead-out line 318aa under the seal 362. Each of the lead-out lines 318aa and 318ab are disposed in a bent state in a plan view. Furthermore, the position of the lead-out line 318b relative to the lead-out line 318a changes in a prescribed pattern. Therefore, the present embodiment can also achieve the effect described in Embodiment 1.

Next, the cross-sectional structure of the liquid crystal panel 301 will be described with reference to FIG. 12.

Figure 12:
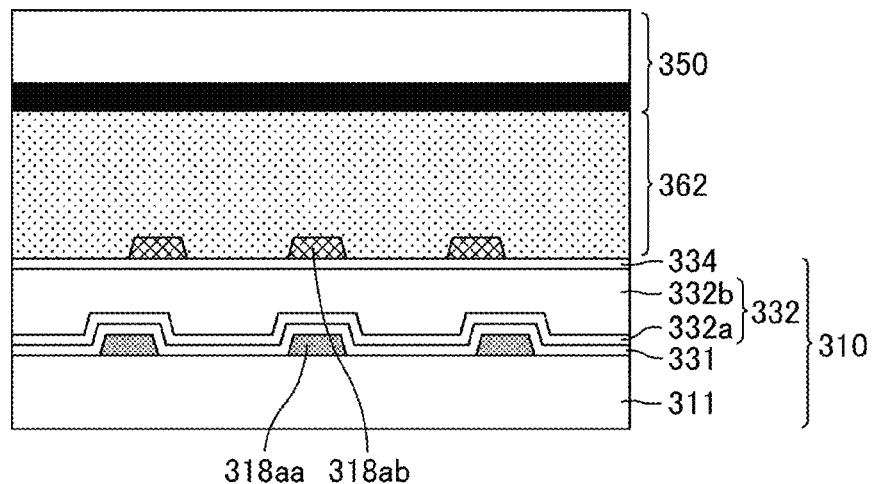
FIG. 12 is a schematic cross-sectional view of FIG. 11 along a line C-D of a liquid crystal panel included in the display device of Embodiment 4.

As shown in FIG. 12, the array substrate 310 has a transparent insulating substrate 311. A gate layer is formed on the insulating substrate 311, and a portion of the lead-out line 318ab, a portion of the lead-out line 318bb, and the gate bus line 313 are provided in the gate layer.

A gate insulating film 331 is formed on the gate layer.

A semiconductor layer (not shown) is formed on the gate insulating film 331.

A source layer is formed on the gate insulating film 331 and the semiconductor layer, and a portion of the respective lead-out lines, the source bus lines 312a and 312b, and the drain electrode (not shown) of the TFT are formed in the source layer.

An interlayer insulating film 332 is formed on the source layer. The interlayer insulating film 332 includes an inorganic insulating film 332a and an organic insulating film 332b on the inorganic insulating film 332a. The interlayer insulating film 332 does not need to include the organic insulating film 332b.

Pixel electrodes (not shown) are formed on the interlayer insulating film 332 and are respectively connected to the drain electrodes through a contact hole (not shown) that penetrates the interlayer insulating film 332. In some cases, the pixel electrodes are formed on the gate insulating film 331. In this case, a portion of the pixel electrode is connected to the drain electrode by overlapping the drain electrode.

An interlayer insulating film 334 is formed on the pixel electrodes. Possible materials for the inorganic insulating film 334 include inorganic insulating materials such as silicon nitride (SiNx) and silicon oxide, for example.

The common electrode 315 and the common layer are formed on the interlayer insulating film 334. At least a portion of the lead-out lines 318aa, at least a portion of the lead-out lines 318ba, and the common bus lines 317 are provided in the common layer. Possible materials for the common electrode 315 include transparent conductive materials such as ITO and IZO, for example. The common layer is formed of a conductive film including materials such as Mo, Ti, Al, Cu, or an alloy of these. The common layer may be formed of a multi-layer film of these conductive films.

The position of the common electrode 315 and the common layer may be switched with the position of the pixel electrodes. In this case, the slits parallel to each other within the respective sub pixel areas are not formed in the common electrode 315, but in the pixel electrode.

In the present embodiment, under the seal 362, the gate insulating film 331 and at least the interlayer insulating film 332 (preferably, interlayer insulating films 332 and 334) are disposed between the lead-out lines 318a and 318b. Therefore, the parasitic capacitance can be reduced even further than Embodiment 1.

Below, a modification example of the present embodiment will be described.

The lead-out lines provided in the gate layer may be provide in the source layer.

Especially in an area that does not overlap the seal 362, three types of lead-out lines that are respectively provided in the gate layer, the source layer, and the common layer may be disposed.

If the display method of the modification example is similar to the present embodiment, i.e., a horizontal electric field display method such as FFS, then the lead-out lines provided in the common layer may instead be provided in a conductive layer having a common electrode. In this case, it is preferable that the conductive layer including the common electrode be formed of a conductive film including a material such as Mo. In this case, the common bus line may be omitted.

The display device of the present embodiment may be a reflective type liquid crystal display or an organic EL display, and the lead-out lines provided in the common layer may be provided in a conductive layer including pixel electrodes. In this case, it is preferable that the conductive layer including the pixel electrode be formed of a conductive film including a material such as Al or silver (Ag).

Below, modification examples of the respective embodiments will be described. The modification examples shown in FIGS. 13 to 18 are substantially the same as the respective embodiments other than that the plan view patterns of the lead-out lines under the seal are different.

Figure 13:
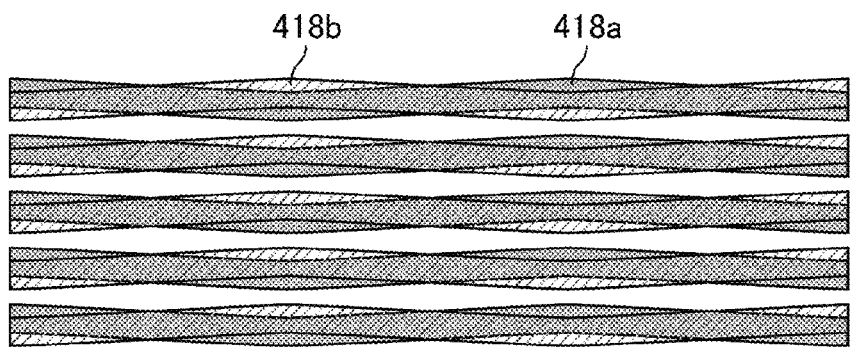
FIG. 13 is a schematic plan view of lead-out lines included in a display device of a modification example of Embodiments 1 to 4.

As shown in FIG. 13, the display device of the respective embodiments may have lead-out lines 418a and 418b. Under the seal (not shown), the lead-out lines 418a are provided in a lower conductive layer, and the lead-out lines 418b are provided in an upper conductive layer. The lead-out lines 418a and 418b extend in a horizontal direction (direction corresponding to the first direction, hereinafter, also referred to as extending direction), and are disposed in a bent state in a plan view.

Figure 14:
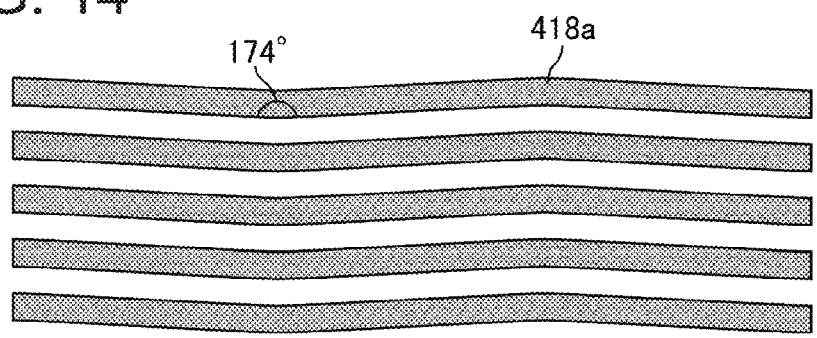
FIG. 14 is a schematic plan view of lead-out lines included in a display device of a modification example of Embodiments 1 to 4.

The respective lead-out lines 418a and 418b are formed in a triangle wave shape in a plan view. Each of the lead-out lines 418a and 418b does not have a flat portion that is parallel to the extending direction, and has a plurality of slanted portions that extend diagonally with respect to the extending direction. As shown in FIG. 14, the angle at which the respective lead-out lines are bent is not limited in particular, and can be set as appropriate, but the angle may be set as approximately 174°, for example.

The respective lead-out lines 418a and 418b are formed in a triangle wave shape in a plan view, and do not have a flat portion, and thus, the present modification example compared to FIG. 2 can bend for a greater number of times, and the period in which the position of the lead-out lines 418a changes with respect to the lead-out lines 418b can be reduced. As a result, the variation in the characteristic value of the products due to shifts in alignment can be effectively reduced. This pattern is suitable for a lead-out line portion that extends in one extending direction for a short distance and has multiple bends such as the lead-out line in the vicinity of a corner portion of the seal. The lead-out lines having multiple bends mean that the extending direction frequently changes within a narrow area.

Figure 15:
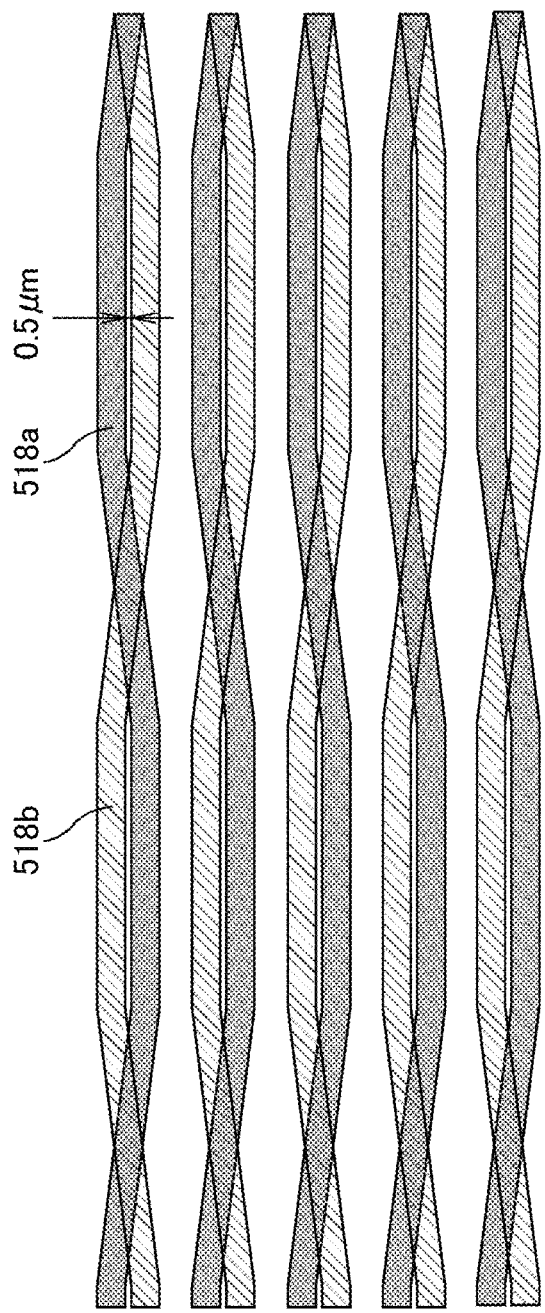
FIG. 15 is a schematic plan view of lead-out lines included in a display device of a modification example of Embodiments 1 to 4.

As shown in FIG. 15, the display device of the respective embodiments may have lead-out lines 518a and 518b. Under the seal (not shown), the lead-out lines 518a are provided in a lower conductive layer, and the lead-out lines 518b are provided in an upper conductive layer. The lead-out lines 518a and 518b extend in a horizontal direction (direction corresponding to the first direction, hereinafter, also referred to as extending direction), and are disposed in a bent state in a plan view.

Each of the lead-out lines 518a and 518b are formed in a trapezoid wave shape in a plan view, and the lead-out lines 518a and 518b include a plurality of flat portions that are parallel to the extending direction, and a plurality of slanted portions that are at an angle with respect to the extending direction.

In FIG. 2, the flat portions of the lead-out lines 18aa and 18ab adjacent to each other overlapped each other. On the other hand, in the present modification example, the flat portion of the lead-out line 518a and the flat portion of the adjacent lead-out line 518b do not overlap. As shown in FIG. 15, the size of the respective gaps between the flat portions are not limited in particular, and can be set as appropriate, but may be set as 0.5 µm, for example.

Figure 16:
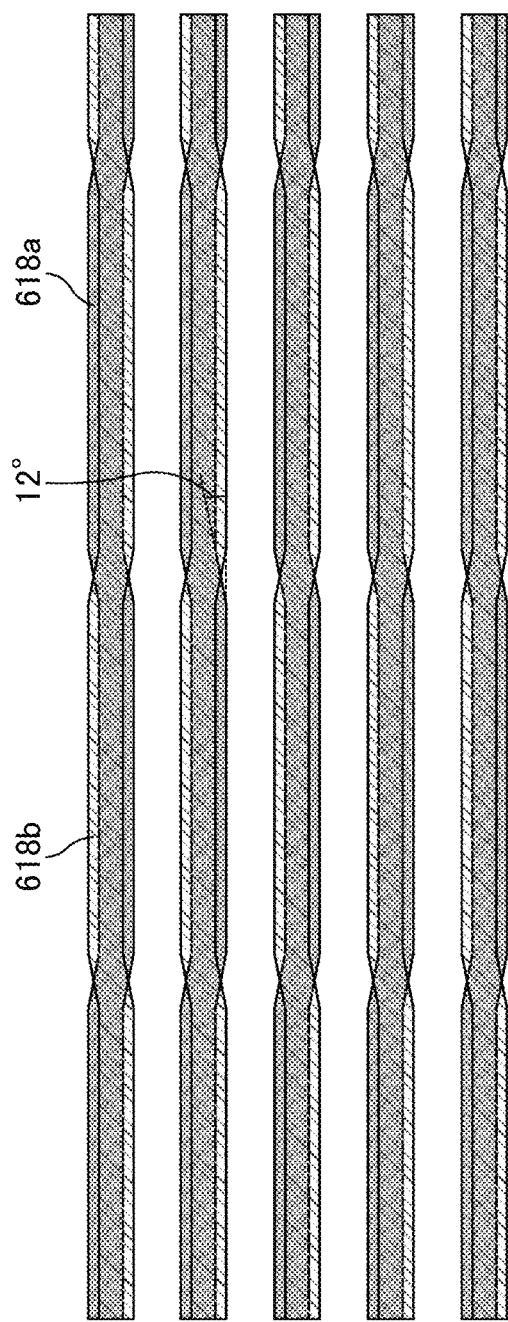
FIG. 16 is a schematic plan view of lead-out lines included in a display device of a modification example of Embodiments 1 to 4.

As shown in FIG. 16, the display device of the respective embodiments may have lead-out lines 618a and 618b. Under the seal (not shown), the lead-out lines 618a are provided in a lower conductive layer, and the lead-out lines 618b are provided in an upper conductive layer. The lead-out lines 618a and 618b extend in a horizontal direction (direction corresponding to the first direction, hereinafter, also referred to as extending direction), and are disposed in a bent state in a plan view.

Each of the lead-out lines 618a and 618b are formed in a trapezoid wave shape in a plan view, and the lead-out lines 618a and 618b include a plurality of flat portions that are parallel to the extending direction, and a plurality of slanted portions that are at an angle with respect to the extending direction. In the present modification example, the angle between the extending direction and the slanted portion is set at substantially 12°.

Figure 17:
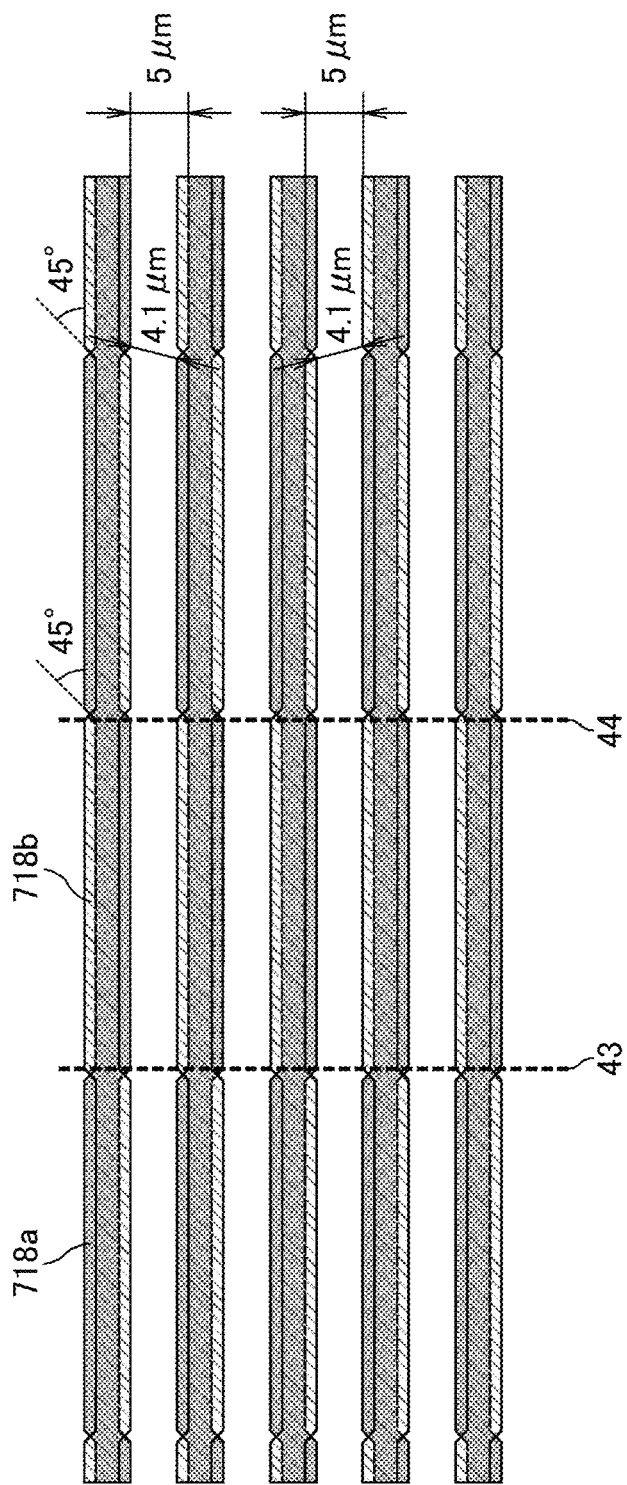
FIG. 17 is a schematic plan view of lead-out lines included in a display device of a modification example of Embodiments 1 to 4.

As shown in FIG. 17, the display device of the respective embodiments may have lead-out lines 718a and 718b. Under the seal (not shown), the lead-out lines 718a are provided in a lower conductive layer, and the lead-out lines 718b are provided in an upper conductive layer. The lead-out lines 718a and 718b extend in a horizontal direction (direction corresponding to the first direction, hereinafter, also referred to as extending direction), and are disposed in a bent state in a plan view.

Each of the lead-out lines 718a and 718b are formed in a trapezoid wave shape in a plan view, and the lead-out lines 718a and 718b include a plurality of flat portions that are parallel to the extending direction, and a plurality of slanted portions that are at an angle with respect to the extending direction. In the present modification example, the angle between the extending direction and the slanted portion is set at substantially 45°.

If the angle of the bending of the respective lead-out lines is increased, then the gap between the slanted portions of the lead-out lines provided in the same conductive layer becomes narrow. If the respective gaps between the flat portions of the lead-out lines 718a and 718b are set as 5 μm, then the respective gaps between the slanted portions of the lead-out lines 718a and 718b become narrower, such as 4.1 μm, for example.

Figure 18:
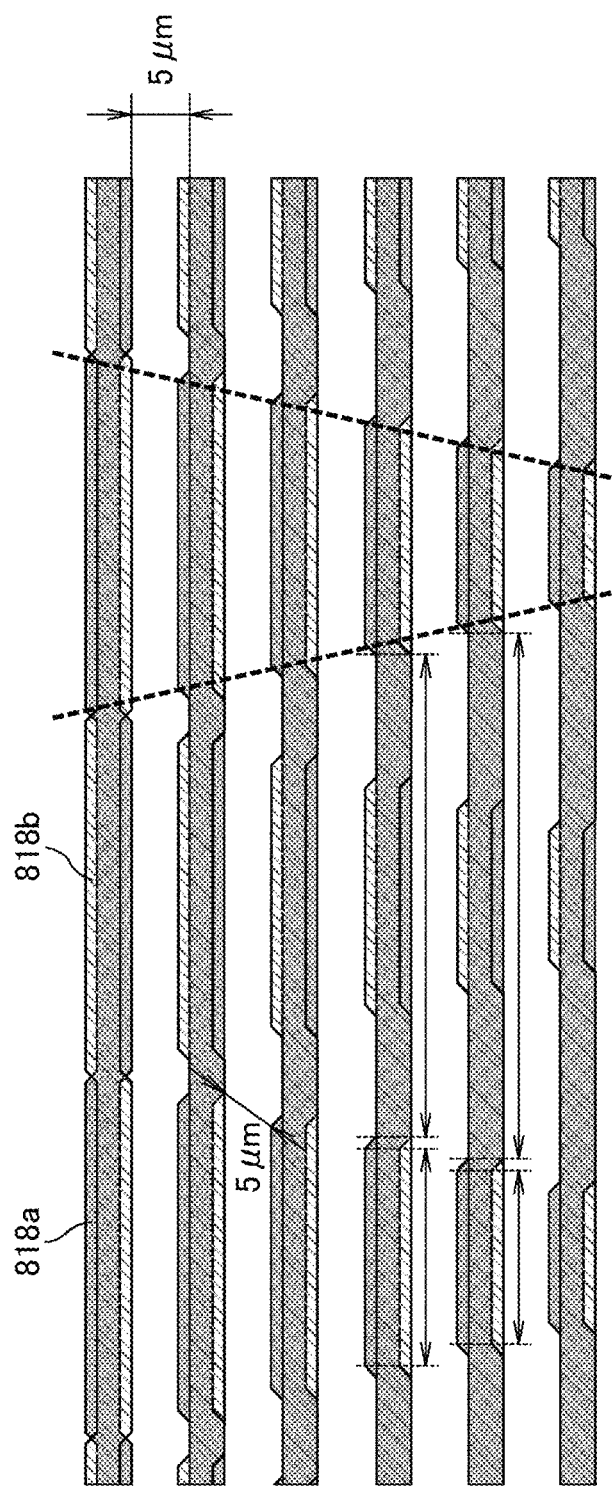
FIG. 18 is a schematic plan view of lead-out lines included in a modification example of Embodiments 1 to 4.

As shown in FIG. 18, from the perspective of preventing the gaps between the slanted portions from becoming small, the display device of the respective embodiments may have the lead-out lines 818a and 818b. Under the seal (not shown), the lead-out lines 818a are provided in a lower conductive layer, and the lead-out lines 818b are provided in an upper conductive layer. The lead-out lines 818a and 818b extend in a horizontal direction (direction corresponding to the first direction, hereinafter, also referred to as extending direction), and are disposed in a bent state in a plan view.

Each of the lead-out lines 818a and 818b are formed in a trapezoid wave shape in a plan view, and the lead-out lines 818a and 818b include a plurality of flat portions that are parallel to the extending direction, and a plurality of slanted portions that are at an angle with respect to the extending direction.

In the present modification example, the position of the slanted portions of the plurality of lead-out lines provided in the same conductive layer changes gradually, and a gap between the slanted portions is secured. In addition, the respective lead-out lines have two types of flat portions having different lengths, and the proportion of the length of the two types of flat portions of the plurality of lead-out lines provided in the same conductive layer is different.

However, in the display devices of the respective embodiments, in many cases, a few hundred to a few thousand lead-out lines are formed, and thus if the frame region is narrow, there are cases in which the layout of the present modification example cannot be arranged. Therefore, as shown in FIG. 17, from the perspective of efficiently disposing multiple lead-out lines in a narrow area, and effectively suppressing the widths of the respective lead-out lines and the gaps between the lead-out lines disposed in the same layer from changing depending on the location, it is preferable that the respective edges of the plurality of flat portions included in the lead-out lines provided in the same conductive layer be positioned on the same virtual line (straight line) 43, the other edge be positioned on the same virtual line (straight line) 44, and the virtual line 43 be substantially parallel to the virtual line 44. As shown in FIG. 16, it is preferable that the angle between the extending direction and the respective slanted portions be less than or equal to 15°. The virtual lines 43 and 44 being substantially parallel means that the angle of the virtual line 43 with respect to the virtual line 44 is less than or equal to 0.1° and it is preferable that the angle be less than or equal to 0.03°.

In the respective embodiments, the pattern of the lead-out lines can be appropriately changed according to the number of lead-out lines (resolution), panel size, width of the frame region, and the like.

Furthermore, in the respective embodiments, the pattern of the characteristic lead-out lines must be formed in at least the seal forming portion, and the pattern of the lead-out lines outside the seal forming portion is not limited. The characteristic pattern mentioned above may be combined with the pattern shown in FIG. 19, and the characteristic pattern mentioned above may be combined with the pattern in which the lead-out lines are provided only in one conductive layer (gate layer or source layer, for example).

Furthermore, in the respective embodiments, the lead-out lines (lead-out lines 18a and 18b and the like, for example) extending in the protruding area along the edge of the array substrate are disposed vertically or horizontally on the display region, but may be disposed only on one side (top, bottom, right, or left side, for example) of the display region. In Embodiment 1, all of the lead-out lines connected to the source bus lines may be disposed on the top side of the display region.

The display device of the respective embodiments may be a monochrome display device, and in that case, the respective pixels do not need to be divided into a plurality of sub pixels.

The respective embodiments mainly described liquid crystal displays, but the type of display device related to the present embodiment is not limited to liquid crystal displays. The display may be a microcapsule-type electrophoretic electronic paper, an organic or inorganic EL display, or the like, for example.

More specifically, the display device of the respective embodiments may be an organic EL display including an ordinary organic EL substrate having an organic EL element corresponding to the first substrate, an opposite substrate corresponding to the second substrate and facing the organic EL substrate, and a seal provided between the organic EL substrate and the opposite substrate. An ordinary organic EL element is susceptible to degradation due to moisture, oxygen, and the like. Thus, in order to protect the organic EL element, an opposite substrate and a seal are provided such that the space between the organic EL substrate and the opposite substrate is sealed. Possible materials for the seal include fritted glass, for example. In addition, from the perspective of improving the adhesive strength of the two substrates, the seal may include a portion in which the fritted glass is cured, and a portion in which the resin is cured. This resin portion is provided in either one or both of the inner and outer side of the fritted glass portion (or, display region side and edge side of the substrate). Specific examples of a resin include an epoxy resin having photocurable properties and/or thermosetting properties, an acrylic resin having photocurable properties and/or thermosetting properties, and a composition including these types of resin, for example.

Furthermore, the display method of a liquid crystal display that can be applied to the respective embodiments is not limited in particular, and can be set as appropriate. The display method may be a TN (twisted nematic) method, an MVA (multi-domain vertical alignment) method, an in-plane switching (IPS) method using a common electrode and pixel electrodes respectively having a comb shaped structure, a TBA (transverse bend alignment) method, or the like. With the TBA method, the liquid crystal layer includes nematic liquid crystal molecules having negative dielectric anisotropy, and the liquid crystal molecules are vertically aligned when no voltage is applied. Furthermore, the array substrate includes a pair of electrodes (common electrode and pixel electrodes respectively having a comb shaped structure, for example), and the liquid crystal molecules are aligned in a bent state due to the horizontal electric field occurring between the electrodes. In particular, a suitable display method of a liquid crystal display includes an array substrate having a transparent common electrode, transparent pixel electrodes, and a dielectric body between the two electrodes (hereinafter, such structure will also be referred to as transparent Cs structure), in which a storage capacitance is formed by these members. Examples of such display methods include a CPA (continuous pinwheel alignment) provided by a transparent Cs structure, for example. In the CPA method having the transparent Cs structure, the liquid crystal layer includes the nematic liquid crystal molecules having negative dielectric anisotropy, and the liquid crystal molecules are vertically aligned when no voltage is applied. Furthermore, the array substrate has a transparent common electrode and an interlayer insulating film on the common electrode, transparent pixel electrodes on the interlayer insulating film, a transparent opposite electrode facing the pixel electrodes, and dot-shaped protrusions (rivets) provided on the opposite electrode. The liquid crystal molecules are aligned radially by the vertical electric field occurring between the pixel electrodes and the opposite electrode with the protrusions in the center. Instead of forming a dot-shaped protrusion (rivet), an opening formed in a circle, cross, or polygon can be formed in the opposite electrode, and the liquid crystal molecules can be arranged radially with the opening in the center.

In the respective embodiments, descriptions of transmissive liquid crystal displays have been provided, but the liquid crystal panel of the respective liquid crystal display may be provided with a reflective display unit that performs display through reflecting ambient light.

The respective configurations mentioned above may be appropriately combined within a scope that does not depart from the gist of the present invention. Modification examples of the respective embodiments may be combined with other embodiments.

DESCRIPTION OF REFERENCE CHARACTERS 1, 201, 301 liquid crystal panel
2, 202, 302 display unit
3, 203 pixel
4, 204 sub pixel
5, 205, 305 driver chip
7, 207, 307 display region
8, 208, 308 frame region
10, 210, 310 active matrix substrate (array substrate)
10a, 10b, 210a, 210b edge
11, 51, 311 insulating substrate
12a, 12b, 212, 312a, 312b source bus line
13, 213a, 213b, 313 gate bus line
315 common electrode
16, 216, 316 common trunk wiring line
16a lower layer portion
16b upper layer portion
17, 217, 317 common bus line
18a, 18aa, 18ab, 18b, 18ba, 18bb, 18c, 118a, 118b, 218a, 218aa, 218ab, 218b, 218ba, 218 bb, 218c, 318a, 318aa, 318ab, 318b, 318ba, 318bb, 318c, 418a, 418b, 518a, 518b, 618a, 618b, 718a, 718b, 818a, 818b lead-out line
25 input wiring line
26, 27a, 27b, 28, 29, 30 terminal
31, 331 gate insulating film
32, 332, 334 interlayer insulating film
32a, 332a inorganic insulating film
32b, 332b organic insulating film
37, 38, 336 contact hole
41a, 41b, 42a, 42b, 141a, 141b, 142a, 142b portion
43, 44 virtual line
50, 250, 350 opposite substrate
52 black matrix (BM)
62, 262, 362 seal

What is claimed is:

1. A display device having a plurality of pixels, comprising:
   a first substrate;
   a second substrate facing the first substrate; and
   a seal provided between the first substrate and the second substrate,
   wherein the first substrate comprises an insulating substrate, a plurality of bus lines provided in a display area and a plurality of lead-out lines provided outside said display area to connect to the plurality of bus lines, respectively,
   wherein the plurality of lead-out lines include a first lead-out line and a second lead-out line,
   wherein the first lead-out line and the second lead-out line include, under the seal, a first portion and a second portion, respectively,
   wherein the first portion and the second portion are provided in a different layer from one another, and extend in a first direction in a plan view,
   wherein the first portion and the second portion partially overlap with each other,
   wherein the first portion has one or more third portions located on one side of the second portion, and has one or more fourth portions located on another side of the second portion in the plan view,
   wherein said one or more third portions and said one or more fourth portions are disposed alternately in the first direction,
   wherein the second portion includes one or more fifth portions located on one side of the first portion, and one or more sixth portions located on another side of the first portion in the plan view,
   wherein said one or more fifth portions and said one or more sixth portions are disposed alternately in the first direction,
   wherein the plurality of lead-out lines include a plurality of the first lead-out lines,
   wherein the plurality of the first lead-out lines include a plurality of the first portions, the respective first portions being arranged in a second direction perpendicular to the first direction,
   wherein each of the plurality of the first portions is formed in a trapezoid wave shape in the plan view and include flat portions parallel to the first direction and slanted portions that extend diagonally with respect to the first direction, wherein respective edges of the flat portions included in each of the plurality of first portions are located on the same first virtual line, wherein the respective other edges of the flat portions are located on the same second virtual line, wherein the first virtual line is substantially parallel to the second virtual line, and wherein the angles respectively formed between the first direction and the plurality of slanted portions of the plurality of first portions are 15° or less.

2. The display device according to claim 1, wherein the first portion and the second portion respectively take a shape of a meandering path in the plan view.

3. The display device according to claim 1, wherein the first substrate has at least two insulating films interposed between the first portion and the second portion.

4. The display device according to claim 1, wherein at least one of the first portion and the second portion have a wave shape in the plan view.

5. The display device according to claim 4, wherein at least one of the first portion and the second portion have a trapezoid wave shape in the plan view.

6. The display device according to claim 4, wherein at least one of the first portion and the second portion has a triangle wave shape in the plan view.

* * * * *